United States Patent
Fujimori et al.

(10) Patent No.: US 7,298,261 B2
(45) Date of Patent: Nov. 20, 2007

(54) PROXIMITY SENSOR

(75) Inventors: Nobuhiro Fujimori, Ayabe (JP);
Satoshi Motouji, Kyoto (JP);
Hidetomo Ohtsuki, Fukuchiyama (JP)

(73) Assignee: Omron Corporation, Kyoto-Shi (JP)

( * ) Notice: Subject to any disclaimer, the term of this patent is extended or adjusted under 35 U.S.C. 154(b) by 192 days.

(21) Appl. No.: 11/094,324

(22) Filed: Mar. 31, 2005

(65) Prior Publication Data

US 2005/0231360 A1   Oct. 20, 2005

(30) Foreign Application Priority Data

Mar. 31, 2004   (JP)   ............................. 2004-103548

(51) Int. Cl.
*G08B 13/24* (2006.01)
(52) U.S. Cl. ...................... 340/551; 324/236; 324/682; 331/64; 340/562; 340/941; 361/180
(58) Field of Classification Search ........... 340/539.23, 340/933, 938, 939, 941, 551, 547, 545.4, 340/561, 562, 565, 566, 567; 331/64, 65, 331/109, 183; 361/181, 180; 324/671, 674, 324/681, 686, 208, 236, 327, 682
See application file for complete search history.

(56) References Cited

U.S. PATENT DOCUMENTS

| | | | | |
|---|---|---|---|---|
| 3,747,012 A | * | 7/1973 | Buck | ............................ 331/65 |
| 3,872,398 A | * | 3/1975 | Fausone et al. | ................ 331/65 |
| 4,678,992 A | * | 7/1987 | Hametta | ................. 324/207.25 |
| 5,034,704 A | * | 7/1991 | Tomioka et al. | ............... 331/65 |
| 5,247,281 A | * | 9/1993 | Facon et al. | ................. 340/562 |
| 5,801,530 A | * | 9/1998 | Crosby et al. | .......... 324/207.26 |
| 6,995,670 B2 | * | 2/2006 | Wadlow et al. | .............. 340/562 |

FOREIGN PATENT DOCUMENTS

DE   100 46 147   2/2002
JP   3440566 B2   6/2003

* cited by examiner

*Primary Examiner*—Brent A. Swarthout
(74) *Attorney, Agent, or Firm*—Foley & Lardner LLP

(57) ABSTRACT

An operation section 2 is provided to a proximity sensor including: a detection section having an oscillation circuit 10; and an amplification section 2 having a function detecting a metal body using an oscillation amplitude of the oscillation circuit 10. In a set mode, when an operation to set an adjustment value for a sensitivity adjustment (a sensitivity adjustment value) is conducted in an operation section 22, CPU 20 generates a sensitivity adjustment signal in digital quantity indicating the sensitivity adjustment value and outputs the signal to a D/A converter 25. The sensitivity adjustment signal digital-to-analog converted by the D/A converter 25 is given to a feedback circuit 13 through a voltage adjustment circuit 26. Since the feedback circuit 13 is designed so as to change a feedback current quantity according to an applied voltage, a current with a magnitude matching a value the sensitivity adjustment signal is fed back to a resonance circuit 11 to thereby control an oscillation amplitude.

8 Claims, 17 Drawing Sheets

(1)

(2)

(3)

PROXIMITY SENSOR

BACKGROUND OF THE INVENTION

1. Field of the Invention

The invention relates to a proximity sensor adopted in applications of determining the presence or absence of a metal body and measuring a distance of the metal body therefrom using a change in oscillation amplitude of an oscillation circuit including a coil.

2. Description of the Related Art

There have been available proximity sensors of this kind in each of which a range (detection range) over which a metal body as a detection object (hereinafter referred to as "body") can be detected is variably set by an adjustment operation of a user. As a typical example, a variable resistor is incorporated in an oscillation circuit and a rotational operation is conducted on the variable resistor to thereby change a current flowing in a feedback circuit of the oscillation circuit.

In Japanese Patent Publication No. 3440566, a proximity sensor with the construction is presented as a conventional example and, besides, a proposal is made on a sensor of a type with improvement in the construction. The sensor of an improved type includes: a sensitivity adjustment circuit having plural series circuits constituted of a resistor and a switch, wherein change-over between combinations of resistors used in sensitivity adjustment is conducted by control with a microcomputer to thereby control a feedback current quantity supplied to a resonance circuit (see FIG. 1 of Japanese Patent Publication No. 3440566). Besides, in the publication, another proximity sensor is also disclosed in which change-over is conducted between resistors in a current mirror circuit determining a feedback current to thereby control a feedback current quantity (see FIG. 15 of Japanese Patent Publication No. 3440566).

Since a relationship between a rotational quantity of a variable resistor and a detection distance is nonlinear in a case where a magnitude of a feedback current is adjusted by a rotational quantity of a variable resistor, a state arises where difficulty is encountered grasping an operational amount necessary to acquire a desired detection distance. Hence, an operator is required repetition of an adjustment operation and confirmation of action of a sensor due to the adjustment, having led to a problem to consume labor and time in the adjustment.

In a proximity sensor of a type adjustment operation of which a user conducts, properness of the adjustment is judged by the intuition or experience of the operator and there is not shown any of indexes each of which is used for determining whether or not an adjusted oscillation amplitude has a sensitivity suitable for detection of a body.

In a case where proximity sensors with the same performance are arranged and the same detection distance can be commonly set to the sensors, sensitivities of the sensors are desirably made uniform. Since a conventional sensor adjustment of which is conducted with a variable resistor is provided with no contrivance enabling an operational quantity to be correctly grasped and there is possibility of causing a variance in the adjustment even by a slight hand movement, difficulty is encountered conducting uniform adjustment. Even if one expert conducts the adjustment in the sensors, it is difficult to avoid generation of a variance in sensitivity over the sensors due to the same reason.

On the other hand, according to a proximity sensor disclosed in Japanese Patent Publication No. 3440566, since a combination of resistors is determined by a microcomputer, many of resistors provided enable proper sensitive adjustment to be implemented depending on a detection distance desired to be set. If many of resistors are provided, the number of parts increases, resulting in a problem of a up-sizing of the equipment and increase in cost. Even this proximity sensor has no means notifying a user of how a sensitivity is set.

SUMMARY OF THE INVENTION

The invention has been made while attention is directed to the problem, and it is a first object of the invention to enable fine adjustment of a sensitivity to be achieved with a small number of parts by adjusting a magnitude of a voltage applied to a feedback circuit of an oscillation circuit by a digital control.

It is a second object of the invention to raise precision in sensitivity adjustment by indicating an index for eliminating a fluctuation in set sensitivity and setting an optimal sensitivity in a case where a sensitivity is adjusted by an adjustment operation of an operator A proximity sensor related to the invention includes: an oscillation circuit having a coil; detection means detecting a metal body using an oscillation amplitude of the oscillation circuit; output means outputting a result of the detection conducted by the detection means; and adjustment means adjusting a state of a change in oscillation amplitude relative to a change in distance between the coil and the metal body.

The detection means of the proximity sensor can include determination means determining the presence or absence of the object by comparison of the oscillation amplitude with a prescribed threshold value. Besides, measurement means measuring a distance from the coil to the body can also be included by collating a value of oscillation amplitude with a predetermined table. While the determination means and the measurement means can be constructed as a logic circuit including a comparator and others, they are preferably constructed using a computer in which a program matching a function of the means is stored.

The output means can be constructed as a circuit outputting a result of the detection by the detection means (the presence or absence of a body, a distance from the coil to the body and others) as a signal in digital quantity or analog quantity to outside. The adjustment means can adjust not only a magnitude of a change in oscillation amplitude relative to a change in distance from the coil to the metal body but also so as to change a magnitude of the distance when an oscillation amplitude reaches a prescribed threshold value.

In a first proximity sensor related to the invention, not only is a feedback circuit designed so as to change a quantity of a feedback current according to an applied voltage incorporated in the oscillation circuit, but the adjustment means also includes: signal generation means generating an adjustment signal in digital quantity indicating a level of a voltage applied to the feedback circuit in the oscillation circuit; and signal output means digital to analog converting the adjustment signal to output the resulted signal to the feedback circuit.

The signal generation means in the adjustment means is desirably constructed with a computer in a similar manner to those in the determination means and the measurement means, while also being able to be constructed with a logic circuit. The signal output means can be constructed with a D/A converter for digital to analog converting an adjustment signal generated by the signal generation means. Besides, the signal output means can also include a buffer, a voltage shift circuit and others.

According to the proximity sensor with the construction, since a voltage level applied to a feedback circuit of the oscillation circuit is set as an adjustment signal in digital quantity and thereafter, a voltage signal obtained by digital to analog converting the adjustment signal is outputted to the feedback circuit, a voltage level can be controlled in each increase or decrease in level by a unit value corresponding to resolution of the D/A conversion. Hence, even without providing many circuits in parallel as in Japanese Patent Publication No. 3440566, a current can be adjusted with increase or decrease by a small unit, thereby enabling fine adjustment of sensitivity to be achieved.

A preferred embodiment of a proximity sensor includes: an operation section for sensitivity adjustment; and a display section for displaying information showing information indicating a value of the adjustment signal or information indicating a magnitude of an oscillation amplitude. The signal generation means in the adjustment means sets a value of the adjustment signal depending on operation in the operation section. Besides, the proximity sensor includes display control means controlling a display on the display section using an oscillation amplitude when a value of the adjustment signal set by the signal generation means or a signal after digital to analog conversion of the adjustment signal is outputted to the feedback circuit.

The operation section and the display section can be provided in equipment body constructing the sensor proper (the amplification section in a case of a sensor including the detection section equipped with a coil and others; and the amplification section). The operation section can be of a push button type switches or keys for inputting numbers, while no specific limitation is placed thereon and the section may be constructed with levers or volumes. The operation section may be constructed so that a value of the adjustment signal itself is inputted, while no specific limitation is placed thereon and information indicating a value of the adjustment signal may be inputted indirectly. For example, a value of the adjustment signal is divided into plural levels and an operation can be conducted so as to select one of the levels.

The display section can be a numerical value display unit displaying an adjustment signal and an oscillation amplitude as are. The display section can also be designed so as to display graphs such as a bar graph, a circle graph and others, and symbols indicating levels of numerical values. In a case where a graph is displayed, a scale for reading a numerical value is attached to the graph so as to enable the reading to be conducted with precision.

The signal generation means can set a value of an adjustment signal according to the number of operations of a button switch or a rotational quantity of a volume to give the value or the quantity to the signal output means. The display control means can use a value of the adjustment signal or a value of an oscillation amplitude measured immediately after the value of the adjustment signal is given to the signal output means to generate display information suitable for specifications of the display section and to output the information to the display section. Note that the display control means is also desirably constructed with a computer.

With the construction adopted, when an operator conducts an operation for sensitivity adjustment, an applied voltage to the feedback circuit changes following the operation to thereby adjust an oscillation amplitude. If, in this situation, a value of the adjustment signal or a value of an oscillation amplitude suitable for adjustment is shown to the operator in advance, the operator conducts an adjustment operation so as to display the information indicating the presented value on the display section, thereby enabling proper sensitivity to be set. In a case where the same detection distance is set to plural proximity sensors with the same performance as well, an adjustment operation is conducted based on a display on the display section, thereby enabling the sensors to be uniformly set in sensitivity. Note that, on the display section, there can be displayed information indicating the value of an adjustment signal and the magnitude of an oscillation information both in parallel. Both can also be displayed alternately.

Then, in another preferred embodiment related to the first proximity sensor, the adjustment means includes: control means causing the signal generating means to repetitively conduct processing changing a value of the adjustment signal stepwise with increase or decrease by a prescribed unit at a time till an oscillation amplitude reaches a prescribed value; and registration means registering a value of the adjustment signal when the oscillation amplitude reaches the prescribed value.

In the above description, the term "a prescribed value" of an oscillation amplitude is a threshold value set in advance for determination of the presence or absence of a body or a value that can be set according to an oscillation amplitude when oscillation enters a saturated state. This setting can be conducted so as to be adapted for a characteristic of an oscillation circuit in use and an application of the sensor.

For example, in a case where an oscillation circuit of a hard oscillation type having a limited range in which a change in oscillation amplitude occurs is used and the circuit detects the presence or absence of a body, a value lower than the threshold value by a sufficient margin can be set to a prescribed value. In a case where an oscillation circuit having a characteristic gradually changing an oscillation amplitude is adopted, and a distance from the coil of the body within the detection distance is measured, a value lower than a saturated level can be adopted as a prescribed value. The prescribed value in this case is desirably at a level of an oscillation amplitude (a level obtained at a position corresponding to the detection distance) in a case where, even if a detection distance takes any value, a sufficient change in amplitude occurs while a body moves in the prescribed range with a position corresponding to the detection distance as a center of the range.

In the above embodiment, the registration means can include a memory for storing adjustment values for an object to be registered.

According to this embodiment, when an operator disposes an object to be detected at a prescribed position, an oscillating amplitude can be measured while a value of a feedback current is automatically changed by repetitive operations by the signal generation means. When the oscillation amplitude measured here assumes a state where the body can be detected with good precision, a value of the adjustment signal at the time point can be registered as a proper one. Thereafter, since a quantity of a feedback current can be adjusted by the registered adjustment signal, the presence or absence of the body and measurement of a distance can be conducted with a precision.

The first proximity sensor includes: temperature measurement means (temperature sensor or the like) for measuring an environmental temperature; and the signal generation means of the adjustment means can include correction means correcting a value of the adjustment signal based on a value measured by the temperature measurement means. With this construction adopted, even if an environmental temperature changes after a proper sensitivity is set, a value of the adjustment signal can be corrected following the change; thereby enabling a proximity sensor resistant to a change in temperature to be provided. In a second proximity sensor related to the invention, the oscillation circuit includes: a feedback circuit designed so as to change a quantity of a feedback current according to an applied voltage; an operation section for setting a value of a voltage applied to the feedback circuit; and a display section displaying information indicating a set value of the voltage or information indicating an oscillation amplitude. The adjustment means is constructed so as to apply a voltage changing according to the setting in the operation section to the feedback circuit in the oscillation circuit.

In the above description, the operation section and the display section can be constructed in a similar way to that in the description of the first proximity sensor.

The adjustment means can be equipped with signal generation means and signal output means similar to those in the first proximity sensor. The adjustment means related to the second proximity is not limited to digital control and can include a way of controlling an applied voltage by adjusting a resistance value related to the feedback circuit (an embodiment that the variable resistors are incorporated and an embodiment that plural resistors are changed over therebetween).

According to the second proximity sensor, when an operator conducts a setting operation on a voltage value, information on a set value of the voltage or a magnitude of an oscillation amplitude is displayed. Hence, by conducting a setting operation till prescribed information is displayed on the display section, a sensitivity suitable for a detection distance is set based on the detection distance. It is possible to eliminate a variance in sensitivity between or among sensors in a case where the same detection distance is set to the sensors with the same performance, thereby enabling higher measurement precision to be achieved.

In the second proximity sensor, a numerical value display section displaying a numerical value corresponding to a voltage set by the operation section or to an oscillation amplitude of an oscillation circuit to which the voltage is applied can be used as the display section. Note that, in a case where a numerical value corresponding to the applied voltage is displayed, the displayed value is not limited to a value of the applied voltage as is and can also be a voltage value after correction obtained by adding an off-set value, or multiplying with a prescribed coefficient. The displayed value can be also a reciprocal of the voltage value or a value specifically obtained by substituting the voltage value into a prescribed equation. In the second proximity sensor as well, analog display can be presented using a graph, a bar code or the like instead of a numerical value.

In a proximity sensor related to the invention, the adjustment means can include voltage control means controlling an applied voltage to the feedback circuit after setting of the voltage by the operation section. The voltage control means changes an applied voltage for setting an oscillation amplitude with a magnitude not reacting with the metal body according to a signal from outside to a value larger than a voltage to be normally set, and further adjusts the applied voltage so as to take a value to be normally set when a prescribed time elapses after the change.

The embodiment described above can be applied to a case where the sensors are activated intermittently in order to prevent mutual interference between or among the sensors in the state where plural proximity sensors are arranged near each other or one another. A signal from outside can be inputted from external equipment controlling the intermittent operation. On the other hand, without using external equipment, the plural proximity sensors mutually communicate with each other or one another, thereby enabling the intermittent operation to be controlled. In this case, a transmission signal from the other sensor can be regarded as the signal from outside. For example, if a state where oscillation occurs with a magnitude thereof reactable with a metal body is considered to be "an operating state," when change-over is conducted from a non-operating state to an operating state or when change-over is conducted from an operating state to a non-operating state, a signal indicating the change-over can be transmitted to the other sensors.

In a case where a signal from outside has any form, the feedback circuit of each proximity sensor, when another sensor is in an operating state, takes a state where the feedback circuit has been applied with a voltage generating an oscillation amplitude with a magnitude non-reactable with the metal body (an amplitude near 0 is desired) occurs or state where the feedback circuit has been absolutely applied with no voltage. When a feedback circuit assumes a state of being operable by a change in external signal, an applied voltage changes to a voltage larger than a voltage set in the previous sensitivity adjustment. The voltage, when a prescribed time elapses, changes to a voltage set in the sensitivity adjustment.

According to the above embodiment, since a large voltage is temporarily applied to the feedback circuit immediately after change-over from a non-operating state to an operating state, an oscillation amplitude can be larger immediately after input of a signal, thereby enabling a time required till an oscillation amplitude thereafter is stabilized to be shortened. Therefore, there can be provided a proximity sensor a response speed of which is fast and that is resistant to noise in a rise time.

According to the invention, since a magnitude of a voltage applied to a feedback circuit of an oscillation circuit is adjusted by digital control and a current matching a magnitude of the applied voltage is fed back in the feedback circuit to thereby control an oscillation state, not only can the number of parts be reduced, but a feedback current can also be finely adjusted. Therefore, a sensitivity can be finely adjusted according to a characteristic of the oscillation circuit and a detection distance.

In the invention, since, in a case where a sensitivity is adjusted by an operation of an operator, the operator can conduct an adjustment operation while recognizing a magnitude of voltage applied to the feedback circuit or a magnitude of an oscillation amplitude to be adjusted by the voltage, an operation for adjusting a sensitivity to properness can be implemented. In a case where the same detection distance is set to sensors with the same performance, as well, an operator conducts an operation while recognizing the contents of a display; thereby enabling a variance in sensitivity between or among the sensors to be eliminated with the result of measurement high in precision.

DESCRIPTION OF THE PREFERRED EMBODIMENTS

Figure 1:
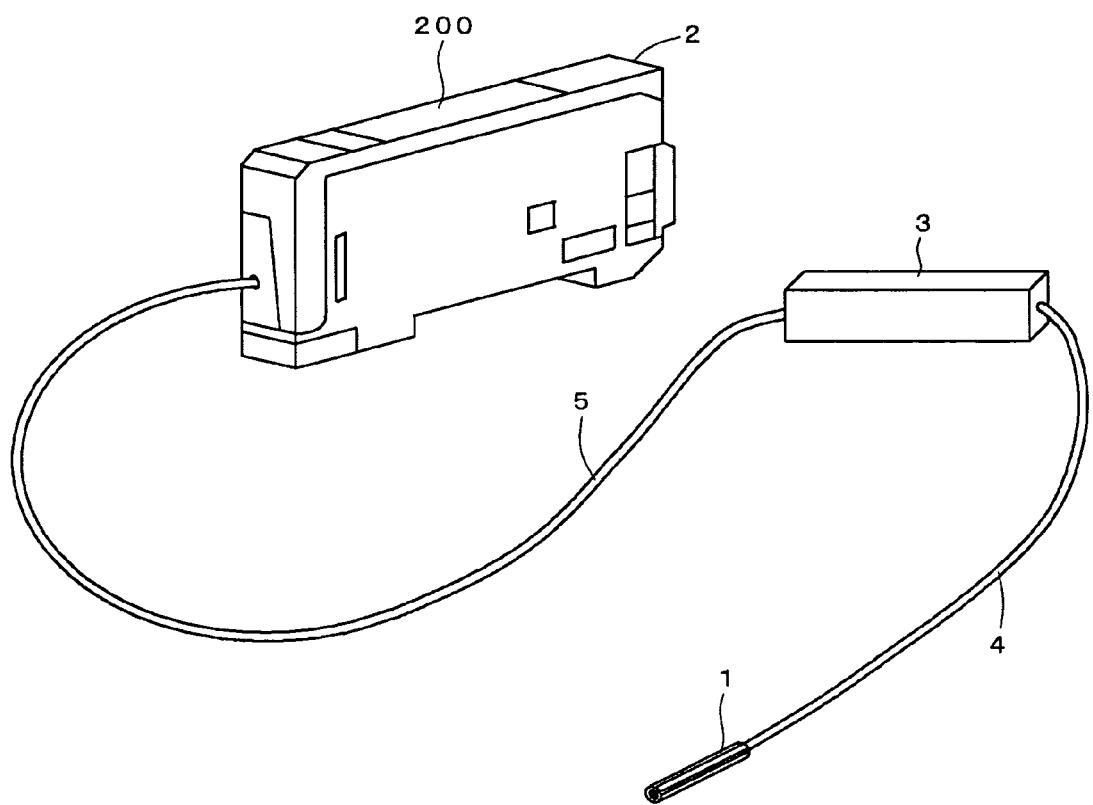
FIG. 1 shows a perspective view showing an appearance of a proximity sensor to which the invention is applied.

FIG. 1 is a perspective view showing an appearance of a proximity sensor to which the invention is related. The proximity sensor of this example includes: a head section 1; a preamplification section 3; and an amplification section 2 having CPU, wherein the constituents are connected by sealed cables 4 and 5. The head section 1 and the preamplification section 3 function as a detection section of the proximity sensor and outputs a detection signal (expressing an oscillation amplitude) changing a magnitude thereof according to a distance to a metal body (hereinafter referred to "body") that is a detection object, from a detection surface (front surface) of the head section 1. The amplification section 2 determines the presence or absence of the body using the detection signal and outputs a result of the determination to outside.

Figure 2:
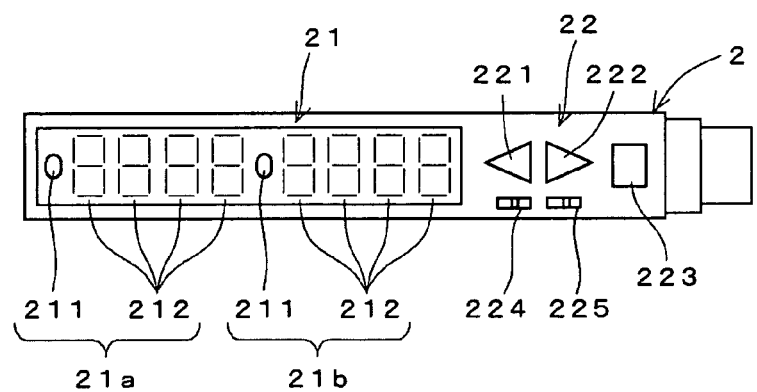
FIG. 2 shows a top plan view showing a detailed construction of a display section and an operation section of an amplification section.

An operation section 22 including plural switches and a display section 21 are provided on the top surface of the amplification section 2 of this example and a cover 200 protects the top portion of the amplification section 2. FIG. 2 shows detailed construction of a top surface when the cover 200 is removed and in the figure, the display section 21 is provided on the left side and the operation section 22 is provided on the right side.

The display section 21 includes: two sets of an LED lamp 211 (hereinafter referred to simply as "lamp 211") and four LED display units 212, which are arranged in the section (wherein a combination of a lamp 211 and four LED display units as a first set is hereinafter referred to "display section 21a" and another combination of a lamp 211 and four LED display units as a second set is hereinafter referred to "display section 21b"). Note that the display section 21a as the first set is constituted of LEDs in red and the display section 21a as the second set is constituted of LEDs in green.

The operation section 22 includes: two selection keys 221 and 222; a determination key 223; change-over switches 224 and 225; and others. The selection keys 221 and 222 and the determination key 223 are used in set modes. The change-over switch 224 is used to change over between the set mode and an ordinary operating mode and the other change-over switch is used to change over operations of an output circuit 27 (on/off signals from the output circuit 27, described later) when a body is detected. Note that in a set mode, a character string indicating setting items and numerical values indicating set values are presented on the display section 21, displays are changed over by operations of the selection keys 221 and 222, and selection of an item and a set value are determined fixed by operation of the determination key 223.

In the set mode, there is included adjustment of sensitivity for causing a body to be detectable at a position desired by a user. This adjustment is conducted in a way such that an adjustment value with a prescribed magnitude is inputted from the operation section 22 and a feedback current of an oscillation circuit is controlled based on the adjustment value. The adjustment value is hereinafter referred to as a "sensitivity adjustment value."

In this example, an initial sensitivity adjustment value is presented on one sub-display section (for example 21a) of the display section 21 and thereafter, a numerical value in display is changed by operations of the selection keys 221 and 222, and a value displayed when the determination key 223 is finally operated is determined as a sensitivity adjustment value. Note that an initial value of the sensitivity adjustment value is 0 and the sensitivity adjustment value is decreased by 1 by operation of the selection key 221 (the value takes no minus value), while the sensitivity adjustment value is increased by 1 by operation of the selection key 222.

Figure 3:
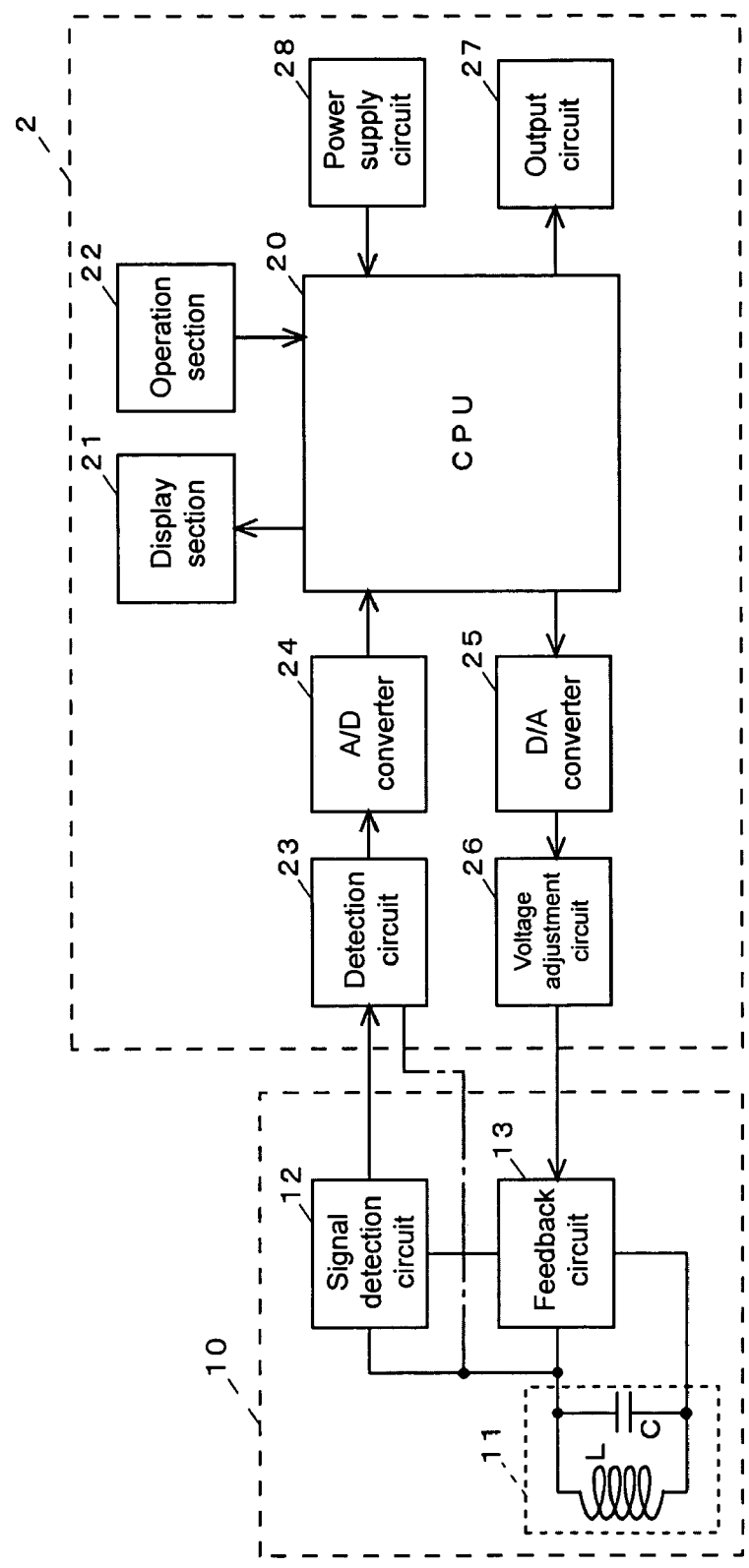
FIG. 3 shows a block diagram showing an electric configuration of the proximity sensor.

FIG. 3 shows an example circuit configuration of the proximity sensor.

The proximity sensor includes an oscillation circuit 10 for detecting a metal body. The oscillation circuit 10 includes: a resonance circuit 11 constituted of a coil L and a capacitor C; a signal detection circuit 12; a feedback circuit 13 and others. Note that the resonance circuit 11 is provided in the head section 1 and the signal detection circuit 12 and the feedback circuit 13 are provided in the preamplification section 3. Note that included in CPU 20 is a memory in which a program and others are stored.

On the other hand, the amplification section 2 includes the CPU; a detection circuit 23; an A/D converter 24; a D/A converter 25; a voltage adjustment circuit 26; an output circuit 27; a power supply circuit 28 and others. The display section 21 and the operation section 22 are connected to CPU 20.

The detection circuit 23 and the A/D converter 24 are provided in an input path from the oscillation circuit 10 to CPU 20. The D/A converter 25 and the voltage adjustment circuit 26 are connected in an output path from CPU 20 and the oscillation circuit 10. The detection circuit 23 and the voltage adjustment circuit 26 can also be provided in the preamplification section 3.

The voltage adjustment circuit 26 is constructed with a buffer, a voltage shift circuit and others. The power supply circuit 28 also supplies power to CPU 20 and the oscillation circuit 10 through the sealed cable 4.

The output circuit 27 is to output a result of the detection of a body to external equipment as a binary signal indicating the presence or absence of the body. The binary signal is hereinafter referred to as an on/off signal, which is placed in an "on state" in a case of "the presence of the body." In a case where the proximity sensor is used in application of measuring a distance to the body, the output circuit 27 can output a voltage signal indicating a magnitude of a measured distance.

Note that the detection circuit 23 usually detects a signal extracted by the signal detection circuit 12 and is, in some case, according to a constitution of the oscillation circuit 10, connected to the resonance circuit 11 as shown with an alternate long and dash line in the figure.

In the above description, an oscillation amplitude of the oscillation circuit 10 gets smaller as the head section 1 approaches the body 1. The detection circuit 23 generates a detection signal indicating a magnitude of the oscillation amplitude. The detection signal is analog-digital converted by the A/D converter 24 and the digital signal is inputted to CPU 20. Since the data input is conducted at intervals of a prescribed time based on an output pulse from a timing generation circuit not shown, CPU 20 captures input data at each timing as a measured value of an oscillation amplitude at the timing and averages measured values over a prescribed number of units thereof. The averaged measured value is compared with a threshold value in the memory to thereby determine the presence or absence of the body and to output a result of the determination from the output circuit 27. A conversion table in the memory is collated with the averaged measured value; thereby enabling a distance to the body to be obtained.

CPU 20 generates an 8 bit signal expressing a sensitivity adjustment value by a key operation in the operation section 22. The signal is hereinafter referred to as a "sensitivity adjustment signal." The sensitivity adjustment signal is not only updated each time when the selection keys 224 and 225 are operated in a set mode, but also outputted to the display section 21 and the D/A converter 25. When a determination operation of the sensitivity adjustment value is conducted, CPU 20 stores the determined value in the memory. In a mode of actual measurement, CPU 20 gives a sensitivity adjustment value read out from the memory to the D/A converter 25 to thereby control an action of the oscillation circuit 10.

A sensitivity adjustment signal digital-to-analog converted by the D/A converter 25 is given to the feedback circuit 13 of the oscillation circuit 10 through the voltage adjustment circuit 26. The feedback circuit 13 is designed so that a magnitude of a feedback current to the resonance circuit 11 is changed by a voltage level of the sensitivity adjustment signal.

Figure 4:
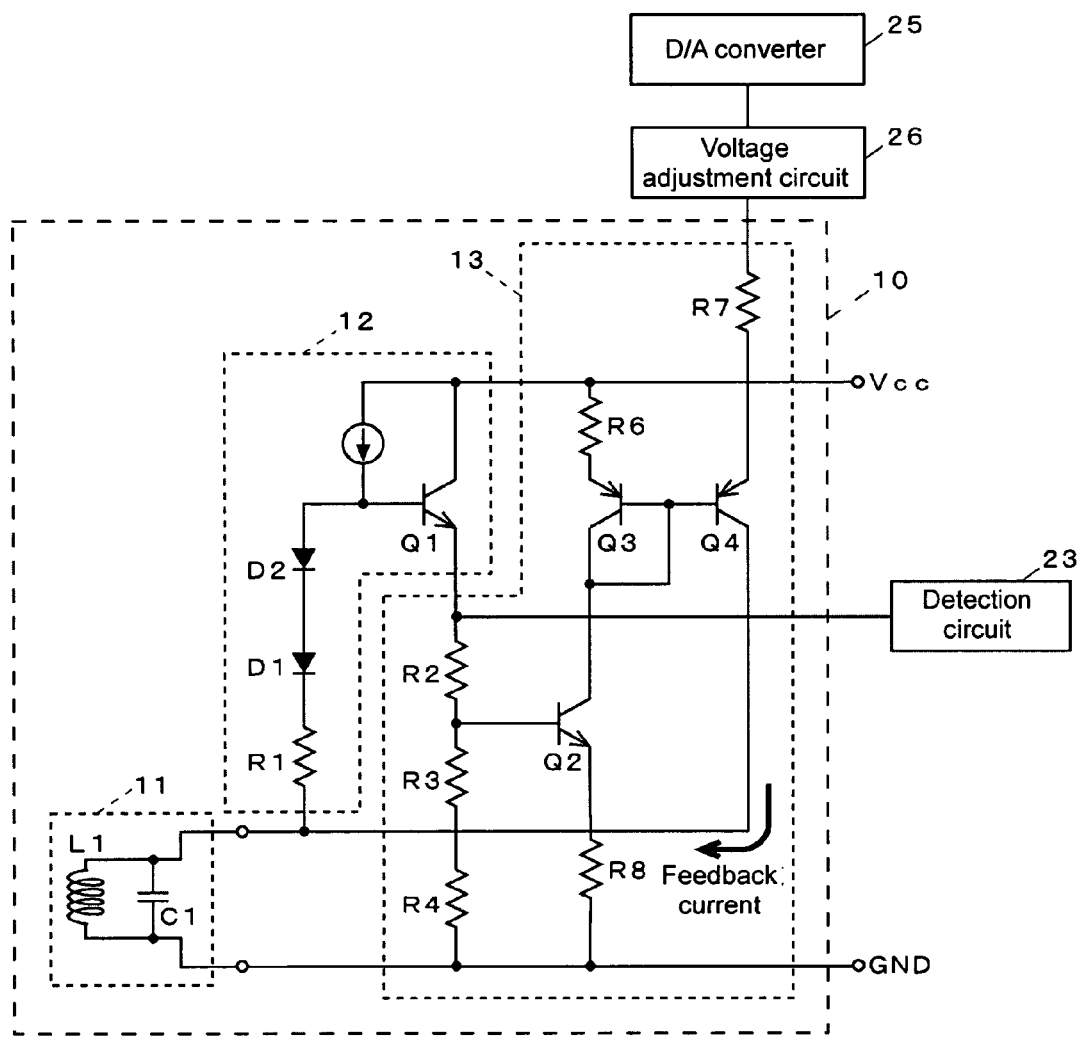
FIG. 4 shows a circuit diagram showing an example configuration of an oscillation circuit.

FIG. 4 shows a concrete example of oscillation circuit 10 in the proximity sensor. Note that, in concrete examples of the oscillation circuits 10 of shown in FIGS. 4 to 8, each of portions corresponding to the resonance circuit 11, the signal detection circuit 12 and the feedback circuit 13 of FIG. 1 is shown in a frame written with a dotted line.

A main part of the oscillation circuit 10 of FIG. 4 is similar to that disclosed in Japanese Patent Publication No. 3440566. To describe the constitution in a simple way, the base of an emitter follower transistor Q1 is connected to one end of the resonance circuit 11 constituted of the coil L1 and the capacitor C1 through a series circuit of a resistor R1 and diodes D1 and D2.

The emitter of the transistor Q1 is connected to a series circuit of resistors R2, R3 and R4 and a branch of a connection line between the resistors R2 and R3 is connected to the base of a transistor Q2. A current mirror circuit constituted of transistors Q3 and Q4 (of PNP type) is connected to the collector of the transistor Q2. The emitter of the transistor Q3 is connected to a power supply Vcc through a resistor R6 and the collector thereof is connected to the transistor Q2 in a similar way to that of the base thereof. The emitter of the other transistor Q4 is connected to the voltage adjustment circuit 26 through a resistor R7 and the collector thereof is connected to a feedback path of the resonance circuit 11.

Figure 16:
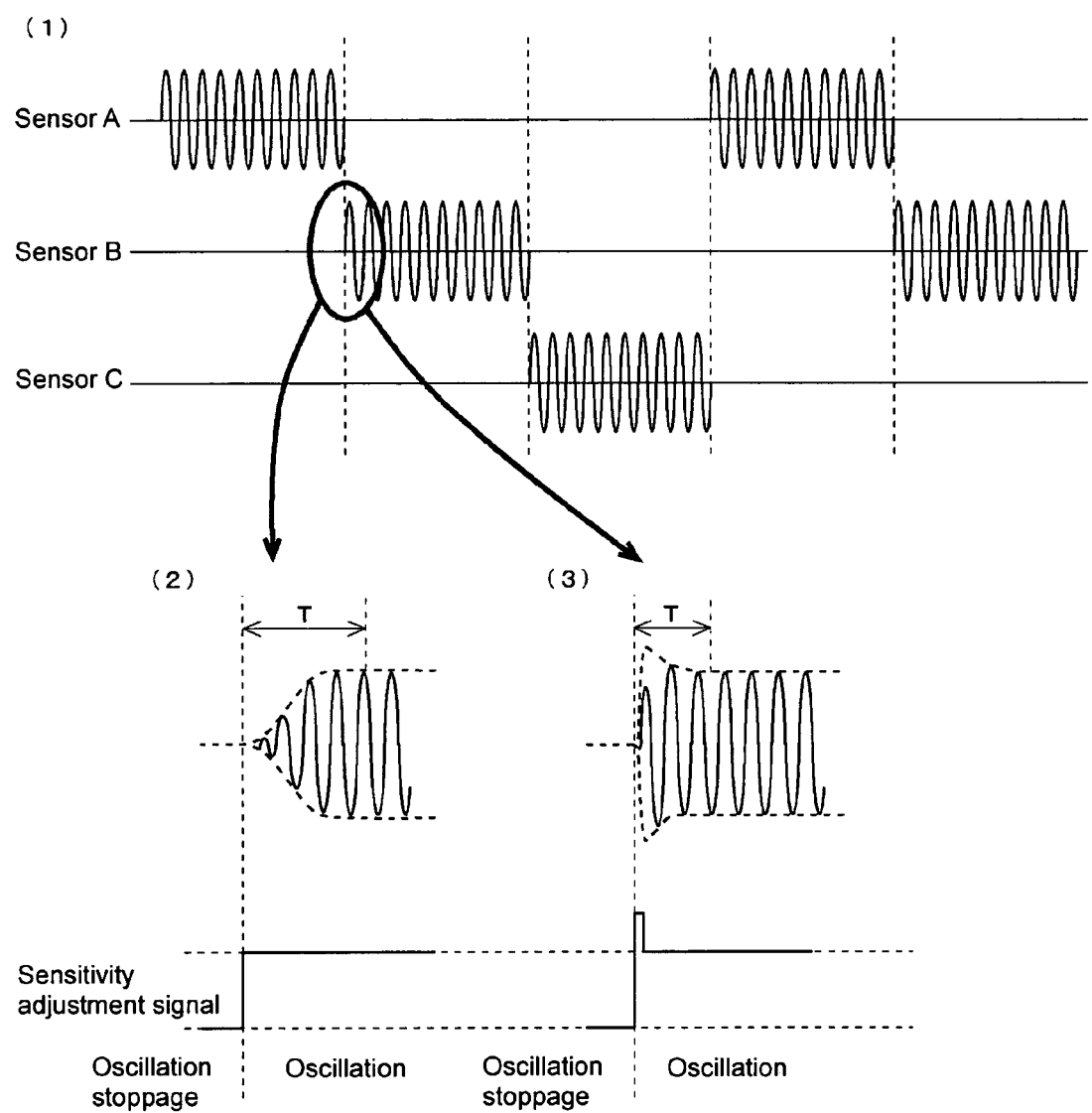
FIGS. 16(1) to 16(3) show descriptive representations showing example controls in cases where an intermittent operation is conducted.

Note that, in this example, a fixed resistor R8 is connected at a position corresponding to the sensitivity adjustment circuit 21 of FIG. 1 described in Japanese Patent Publication No. 3440566 or a sensitivity adjustment resistor Re of FIG. 16, that is between the transistor Q2 and ground potential.

In the above configuration, a signal of the resonance circuit 11 is inputted to the base of the transistor Q1 through the diodes D1 and D2 and thereafter, further inputted to the base of the transistor Q2. A change in signal of the resonance circuit 11 is extracted by the signal detection circuit 12 constituted of the transistor Q1 and the resistors R2, R3 and R4 and the change is given to the detection circuit 23.

A current with the same magnitude as a current flowing in the transistor Q2 flows in the transistor Q3 of the current mirror circuit. On the other hand, while a potential of the emitter of the transistor Q4 is equal to that of the emitter of the transistor Q3, the voltage adjustment circuit 26 is connected thereto; therefore a current quantity flowing in the transistor Q4 is controlled by a difference in voltage between an output of the voltage adjustment circuit 26 and the emitter. That is, as a sensitivity adjustment signal from the D/A converter 25 increases, a difference in voltage between an output of the voltage adjustment circuit 26 and the emitter of the transistor Q4 also increases, and a current flowing in the transistor Q4 also increases.

Figure 5:
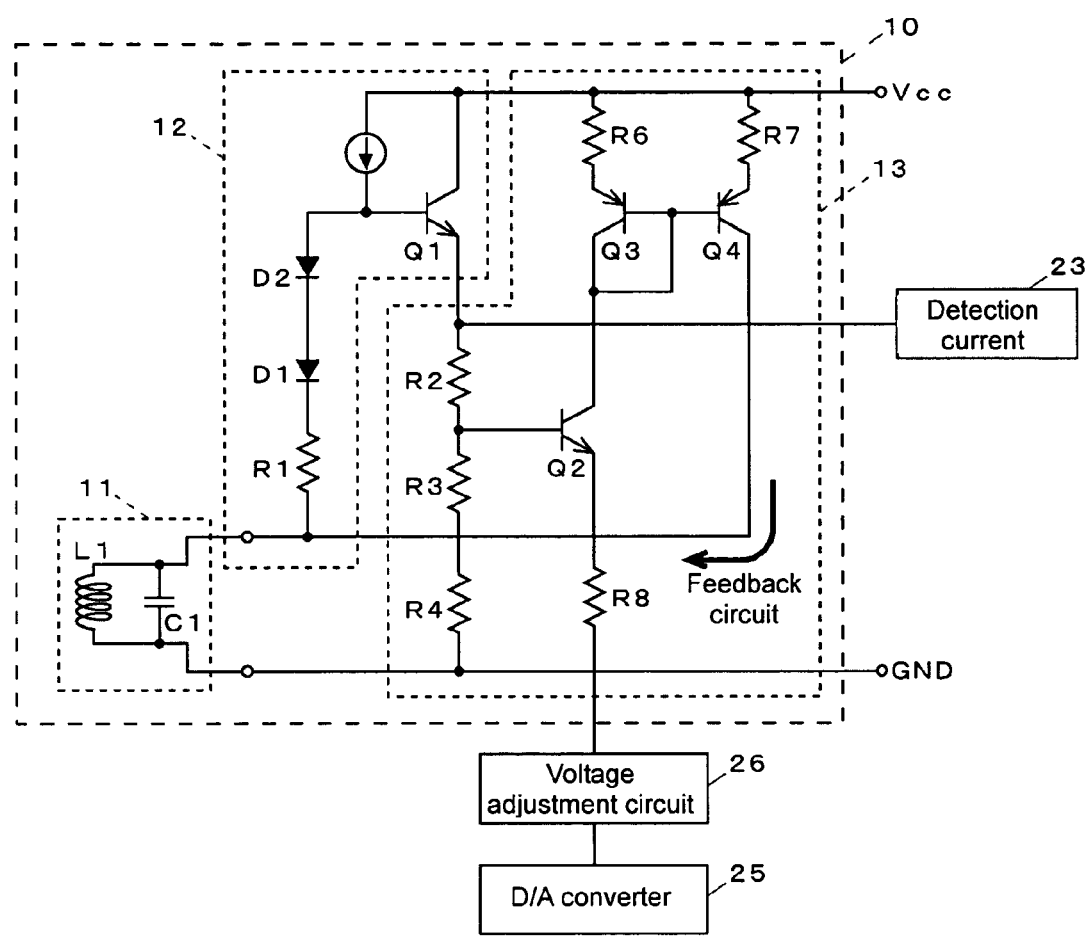
FIG. 5 shows a circuit diagram showing an example configuration of an oscillation circuit.

FIG. 5 shows a second example of the oscillation circuit 10. The main parts of this circuit is similar to that of FIG. 4 but the voltage adjustment circuit 26 and the D/A converter 25 are connected to the emitter of the transistor Q2 through the resistor R8. On the other hand, the emitter of the transistor Q4 is connected to the power supply Vcc in a similar way to that of the transistor Q3. Note that the other parts of the constitution are indicated with the same symbols as those in FIG. 4 and thereby, descriptions thereof are omitted.

In the second example, a collector current flowing in the transistor Q2 is controlled by a voltage across both ends of the resistor R8, that is a difference in voltage between an output of the voltage adjustment circuit 26 and the emitter of the transistor Q2. Hence, as a sensitivity adjustment signal from the D/A converter 25 increases, a collector current of the transistor Q2 also increases, and with increase in the collector current, a feedback current from the transistor Q4 also increases.

Figure 6:
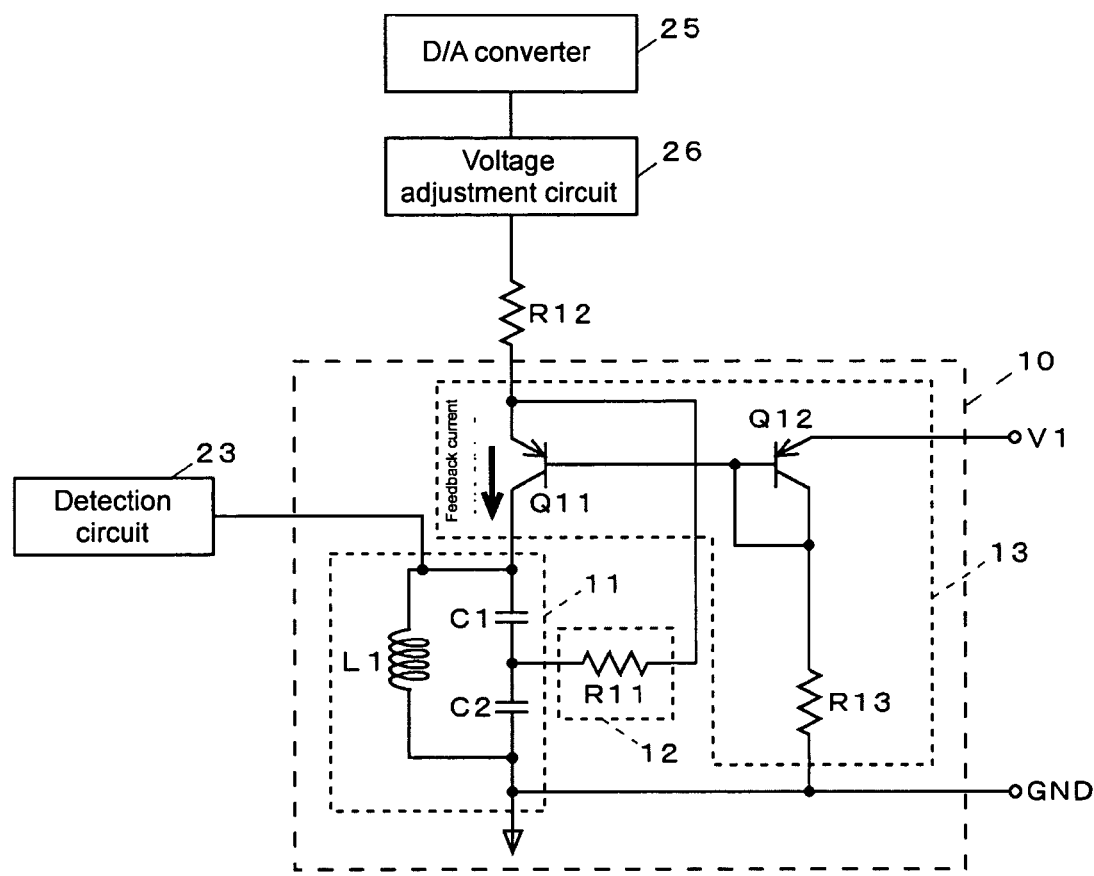
FIG. 6 shows a circuit diagram showing an example configuration of an oscillation circuit.

FIG. 6 shows a third example of the oscillation circuit 10. The resonance circuit 11 of the oscillation circuit 10 is constructed by connecting a series circuit of two capacitors C1 and C2 and a coil L1 in parallel to each other. A PNP type transistor Q11 is connected to the resonance circuit 11. A feedback circuit 13 is constituted of a current mirror circuit including the transistor Q11 and a second transistor Q12. A resistor R11 connected between a connection point between the capacitors C1 and C2 and the emitter of the transistor Q11 functions as the signal detection circuit 12. Note that, in this example, the detection circuit 23 is directly connected to the resonance circuit 11.

The emitter of the transistor Q12 is connected to a prescribed potential V1 lower than the power supply Vcc and the collector and base thereof are connected to ground potential through a resistor R13. The emitter of the transistor Q11 is connected to the voltage adjustment circuit 26 through a resistor R12.

In the oscillation circuit 10, a signal extracted by the resistor R11 is inputted to the emitter of the transistor Q11 and a current corresponding to a change in the signal is fed back from the transistor Q11 to the resonance circuit 11. While a potential at the emitter of the transistor Q11 is the same as that of the emitter of the transistor Q12, a magnitude of a current changes under an influence of the output voltage of the voltage adjustment circuit 26 since the emitter of the transistor Q11 is connected thereto. That is, as a sensitivity adjustment signal from the D/A converter 25 increases, a difference in voltage between an output of the voltage adjustment circuit 26 and the emitter of the transistor Q11 increases and a feedback current also increases in company therewith.

Figure 7:
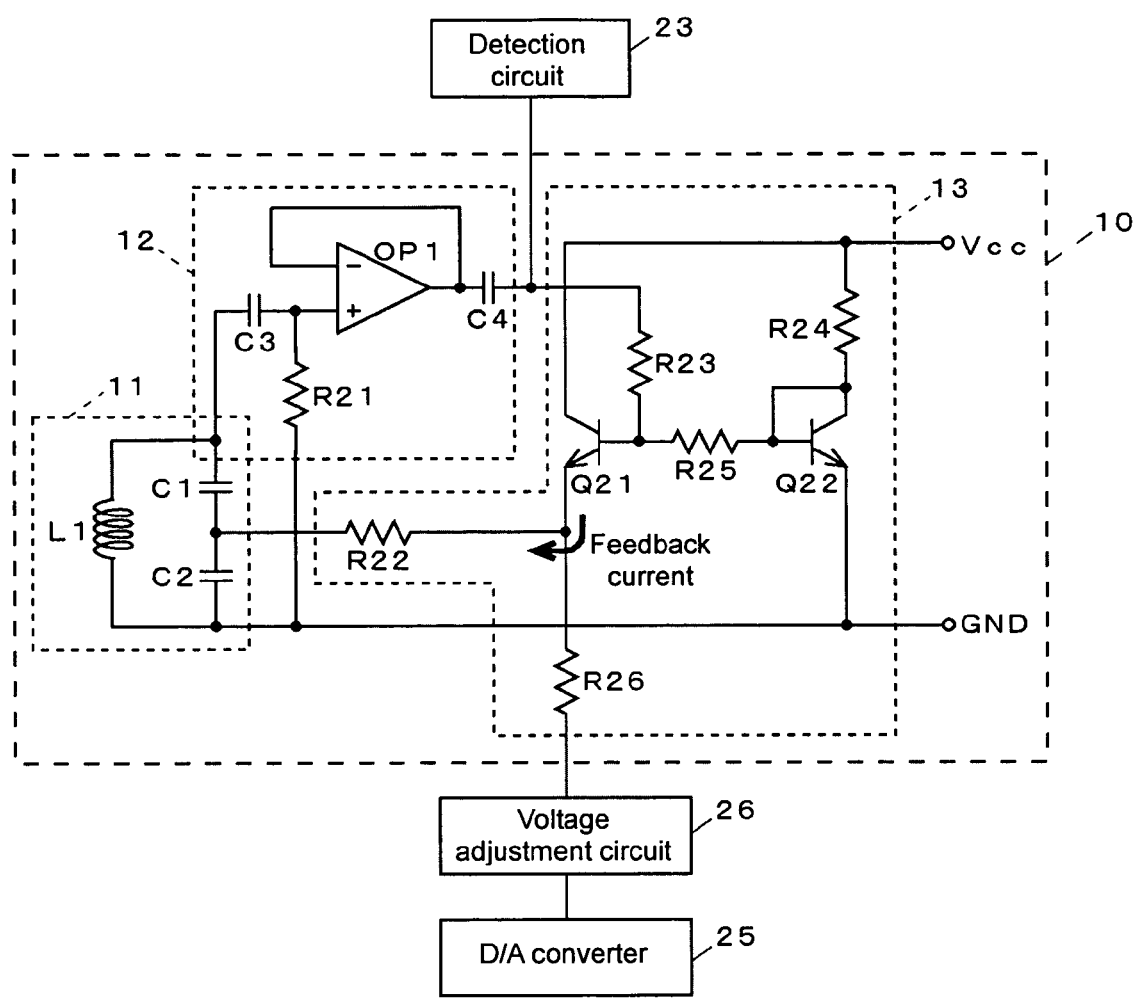
FIG. 7 shows a circuit diagram showing an example configuration of an oscillation circuit.

FIG. 7 shows a fourth example of the oscillation circuit 10. While the resonance circuit 11 in this example is of a construction similar to that of FIG. 6, the signal detection circuit 12 is constructed with: capacitors C3 and C4; an operational amplifier OP1; a pull-down resistor R21; and others. The feedback circuit 13 is constructed with transistors Q21 and Q22 (NPN type) constituting a current mirror circuit; resistors R22, R23, R24, R25 and R26; and others.

The operational amplifier OP1 is inputted with a signal of the resonance circuit 11 through a capacitor C3 and amplifies under negative feedback applied thereto. The amplified output is inputted not only to the detection circuit 23 through a capacitor C4, but also to the bases of the transistors Q21 and Q22 through the resistor R23. Note a resistor R25 is provided in an input line to the bases.

The collecter of the transistor Q22 is connected to power supply Vcc through a resistor R24 and the emitter thereof is grounded. Not only is the collector of the transistor Q21 connected to power supply Vcc but a connection path on the emitter side thereof is branched in two ways, one of which is connected to the voltage adjustment circuit 26 through a resistor R26. The other of the branches serves as a feedback circuit to the resonance circuit 11 including the resistor R22.

A current according to a change in signal of the resonance circuit 11 flows in the transistor Q21. The current is fed back from the emitter of the transistor Q21 to the resonance circuit 11 through the resistor R22. In this configuration, as a sensitivity adjustment signal from the D/A converter 25 increases, a difference in voltage between an output of the voltage adjustment circuit 26 and the emitter of the transistor Q21 increases and as a result, a feedback current increases.

Figure 8:
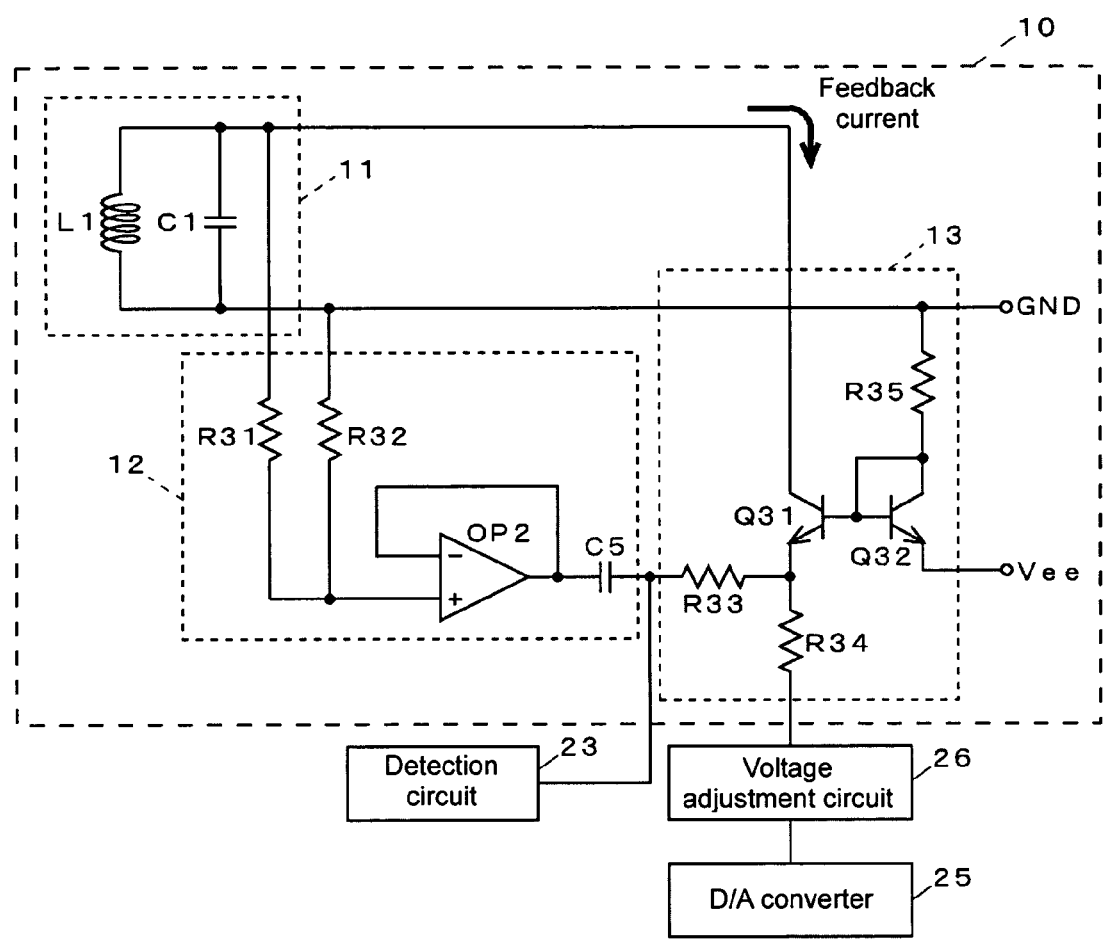
FIG. 8 shows a circuit diagram showing an example configuration of an oscillation circuit.

FIG. 8 shows a fifth example of the oscillation circuit 10. In this example, the resonance circuit 11 similar to those in the example of FIGS. 4 and 5 is connected to the signal detection circuit 12 including an operational amplifier OP2. A current mirror circuit constituted of NPN type transistors Q31 and Q32 is provided in the feedback circuit 13.

The signal detection circuit 12 includes: the operation amplifier OP2; resistors R31 and R32; and a capacitor C5. A signal of the resonance circuit 11 is extracted by the resistors R31 and R32 and then inputted to the operational amplifier OP2. An amplified output of the operational amplifier OP2 is outputted to the detection circuit 23 and the feedback circuit 13 through the capacitor C5.

The bases of the transistors Q31 and Q32 and the collector of the transistor Q32 are connected to ground potential through a resistor R35. The emitter of the transistor Q32 is connected to a negative potential Vee. The collector of the other transistor Q31 is connected not only to the resonance circuit 11, but also a connection line on the emitter side is branched in two ways and one of the branches is connected to the capacitor C5 of the signal detection circuit 12 through a resistor R33, while the other thereof is connected to the voltage adjustment circuit 26 through a resistor R34.

In this example, a current flows from the resonance circuit 11 in a direction toward the voltage adjustment circuit 26 through the transistor Q31. That is, when an oscillation amplitude is on the negative side, a current is pulled from the resonance circuit 11 by the transistor Q31, therefore an oscillation amplitude grows on the negative side to supply energy to the resonance circuit 11. A feedback current in this case is determined by a difference in voltage between the emitter of the transistor Q31 and an output of the voltage adjustment circuit 26.

Of the five example oscillation circuits 10, the oscillation circuit 10 with the construction of FIG. 4 or 5 generates a large change in oscillation amplitude while a body moves between a position spaced apart from the coil by a prescribed distance (temporarily referred to point A) and another point further spaced, in the rearward direction, apart from the coil (temporarily referred to point B), while no oscillation occurs at a position in the forward direction from the point A and oscillation is saturated at a position in the rearward direction from the point B. Such an oscillation state is referred to a "hard oscillation."

On the other hand, with the oscillation circuit 10 with the configuration of one of FIGS. 6 to 8, an oscillation amplitude changes gradually, depending on a distance between the body and the coil before oscillation amplitude does not reach a level. Such an oscillation state is referred to a "soft oscillation." In a case where any of both constructions are adopted, the on/off signal can be placed in an on state, when oscillation transitions to a state where an oscillation amplitude is smaller than a prescribed threshold value from a state where an oscillation amplitude is larger than the prescribed threshold value. In a case where a distance of a body is required to be measured, a soft oscillation type oscillation circuit 10 is adopted. In this case, a table prepared from characteristic curves shown in FIG. 9(1) is stored in a memory and a distance can be obtained by collating a characteristic curve adapted for a set sensitivity with measured values of oscillation amplitude.

According to the oscillation circuit 10 with any of the constructions shown in FIGS. 4 to 8, a feedback current to the resonance circuit 11 can be adjusted by changing sensitivity adjustment signal from the D/A converter 25. Since a sensitive adjustment signal is in essence an 8 bit digital signal indicating a sensitivity adjustment value, a voltage applied to the feedback circuit 13 can be changed by a prescribed unit at each time by changing a sensitivity adjustment value by 1 at a time. Hence, adjustment of sensitivity can be implemented in a finer and simpler way as compared with a case where sensitivity adjustment is conducted with change-over between resistors.

Figure 9:
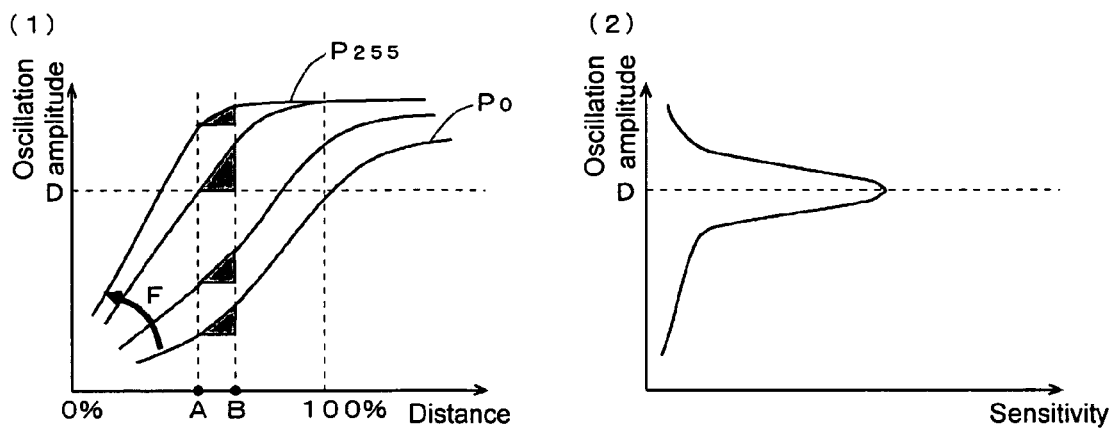
FIGS. 9(1) and 9(2) show graphs showing characteristic curves of an oscillation amplitude vs. a distance and a relationship between an oscillation amplitude and a sensitivity.

FIG. 9(1) is a graph showing a relationship between a distance from a coil to a body and an oscillation amplitude and the graph shows that a relationship therebetween changes according to the sensitivity adjustment value. Note that curves shown on the graph (hereinafter referred to as "characteristic curves") are obtained in a case where the soft oscillation type oscillation circuit 10 of one of FIGS. 6 to 8 is employed. A distance on the abscissa is a normalized one of an actual distance of the body obtained by giving a detection distance as a rating (a detection distance guaranteed by a maker as detectable) a numerical value of 100%.

In the graph, a characteristic curve $P_0$ shows a relationship at a sensitivity adjustment value of 0 and a characteristic curve $P_{255}$ shows a relationship at the maximum adjustment value of 255. Characteristic curves at other sensitivity adjustment values are arranged along a direction from the curve $P_0$ to the curve $P_{255}$ (along a direction shown by an arrow symbol F in the figure) in the ascending order by sensitivity adjustment value.

According to the graph, in the range of a detection distance as a rating, an oscillation amplitude grows with increase in sensitivity adjustment value. Since an oscillation amplitude is saturated under an influence of internal voltage in the circuit, a sensitivity is, to the contrary, reduced as an oscillation amplitude approaches a saturated state by increase in sensitivity adjustment value, however.

For example, in the graph of FIG. 9(1), in a case where a distance of a body is measured in a range of from the point A to the point B on the distance axis, a measurement precision can be raised with a larger change in oscillation amplitude relative to a distance (which is shown as a slope of a triangle in each curve as a model) between the points A and B. That is, a slope of each curve can be obtained as a parameter indicating a sensitivity.

FIG. 9(2) is a graph obtained by plotting sensitivity values of the curves relative to oscillation amplitudes around the point A. As shown in the graph, as an oscillation amplitude increases, a sensitivity increase till an oscillation amplitude reaches to a value D, whereas as an oscillation amplitude further increases beyond the value D and approaches a saturated state, a sensitivity decreases. A characteristic curve corresponding to a sensitivity peak varies according to a detection distance. Hence, by obtaining a characteristic curve corresponding to a sensitivity peak for each detection distance, detection processing for a body is placed in the best state in terms of precision.

Figure 10:
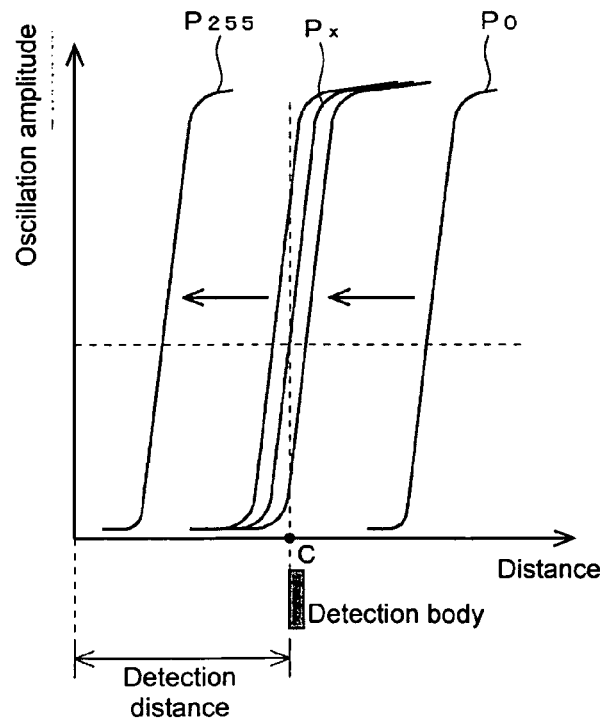
FIG. 10 shows a graph showing other examples of characteristic curves of an oscillation amplitude vs. a distance.

FIG. 10 shows other characteristic curves in a case where a hard oscillation type oscillation circuit 10 shown in one of FIGS. 3 and 4 is employed. Note that in this figure as well, a characteristic curve is indicated by $P_0$ at a sensitivity adjustment value of 0 and a characteristic curve is indicated by $P_{255}$ at an adjustment value of 255. Characteristic curves at other sensitivity adjustment values are arranged between $P_0$ and $P_{255}$.

In a case of the oscillation circuit 10 of this kind, while any curve has a similar slop of a change in oscillation amplitude, a range in which the change occurs moves forward with increase insensitivity adjustment value. Hence, a user obtains in advance a characteristic curve $P_x$ such that a position of a body to be desired to be detected by the user (a point C in the figure) is included in the range of a change in oscillation amplitude, and a sensitivity adjustment value corresponding to the curve $P_x$ is set, thereby enabling the body to be stably detected.

Figure 15:
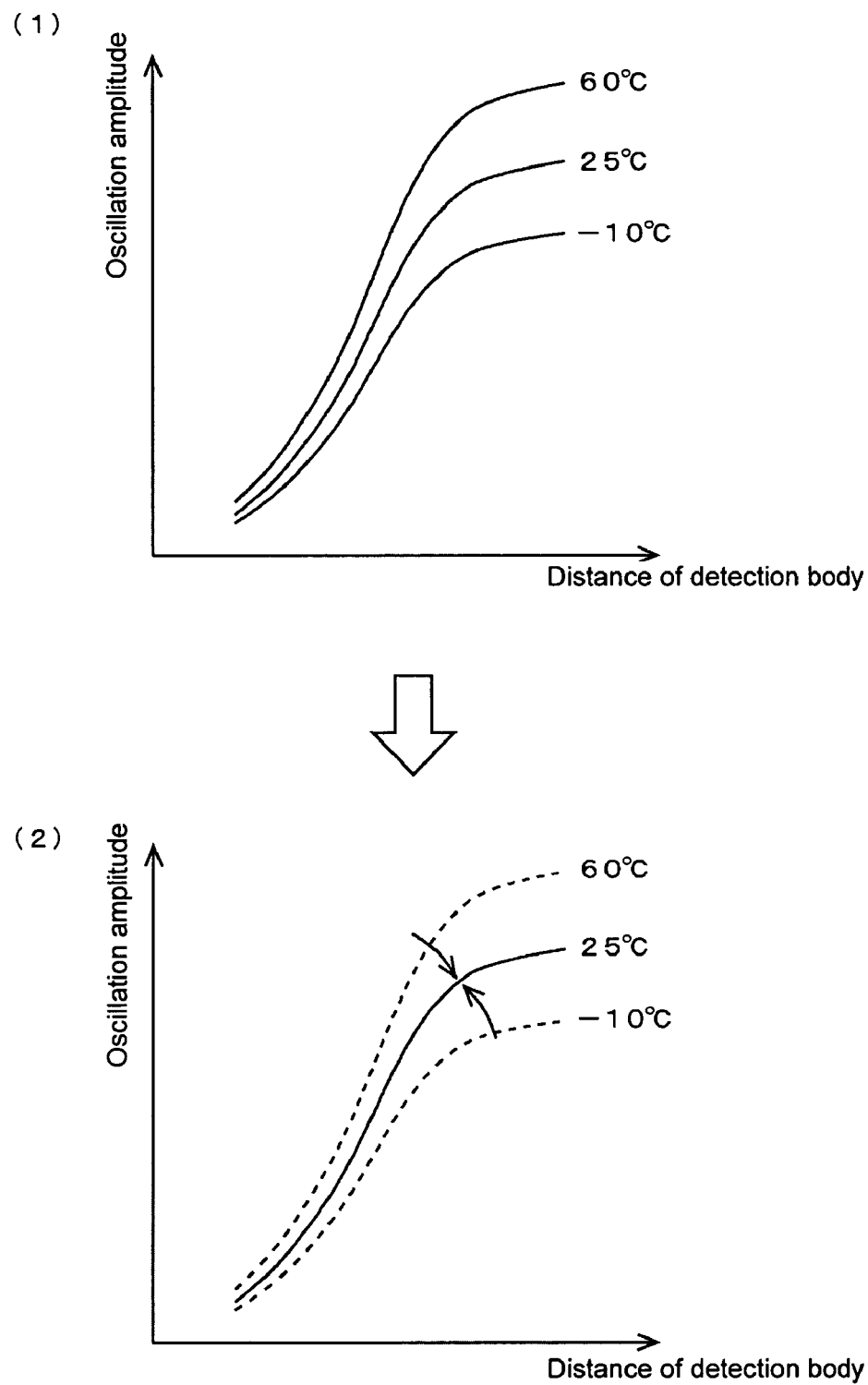
FIGS. 15(1) and 15(2) show graphs showing example sensitivity adjustment matching a change in temperature.

An oscillation amplitude of the oscillation circuit 10 has, as shown in FIG. 15 described later, a possibility of a change therein due to an external factor such as a change in temperature. Hence, in a case where the oscillation circuit 10 having a characteristic as shown in FIG. 10, if a distance to the point C from the coil is more than a detection distance of a rating, the action becomes unstable and a possibility arises that a body cannot be detected correctly. Therefore, the point C is necessary to be set at a point in a forward direction shorter than the detection distance of a rating.

Figure 11:
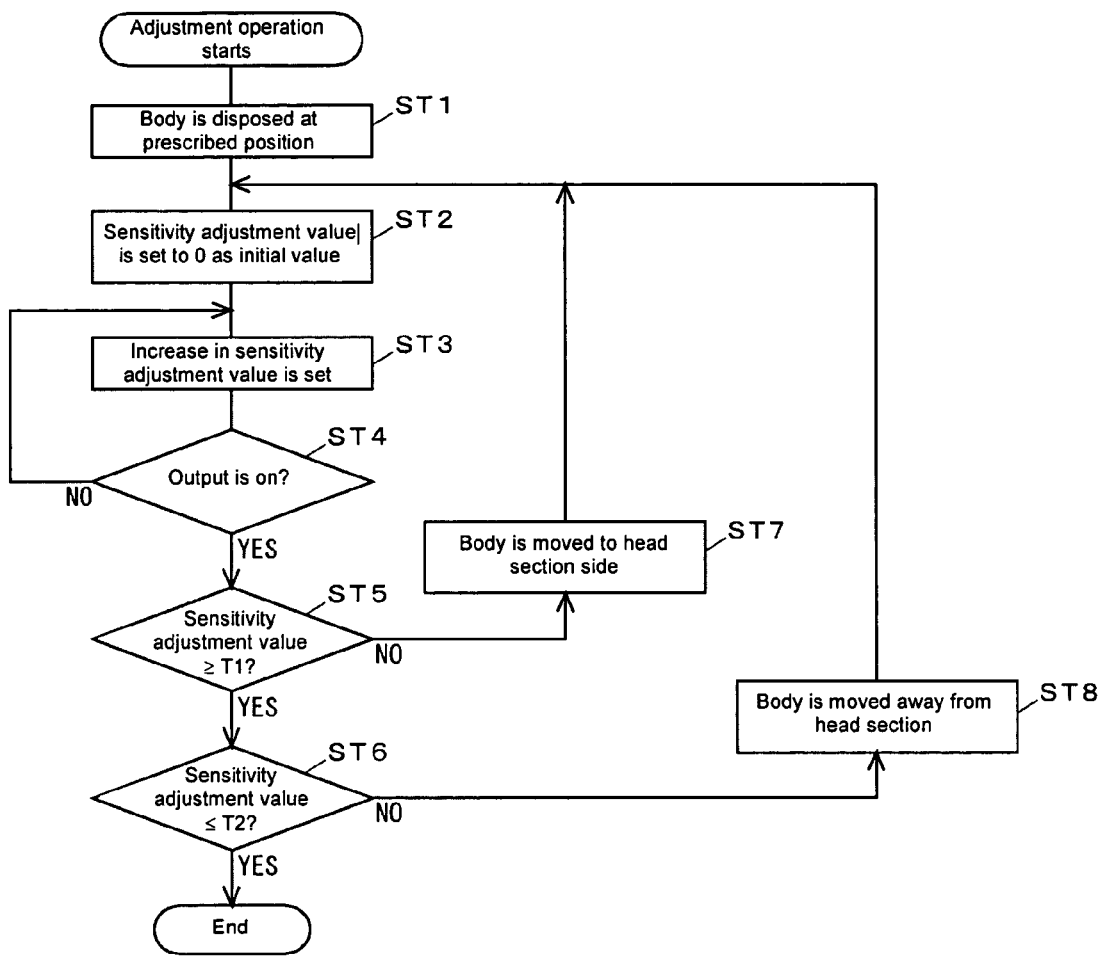
FIG. 11 shows a flowchart showing a procedure of an adjustment operation.

In a case where the hard oscillation type oscillation circuit 10 is employed in the proximity sensor with one of the constructions of FIGS. 1 to 3, a sensitivity is, in light of the above point, adjusted by a procedure that a user conducts as shown in FIG. 11 described below. Note that in FIGS. 11 and 12, a step is abbreviated as ST in description. In the description presented below, ST is used instead of a step in conformity with the above abbreviation.

The procedure is started after the head section 1 of a proximity sensor is located at a prescribed position. First of all, in a first ST1, a body that is a detection object is disposed at a position spaced apart from the head section 1 by a prescribed distance. In ST2, a sensitivity adjustment value is set to an initial value of 0 in response to operations such as selection of a sensitivity adjustment mode from the menu of set modes.

In such a situation, a sensitivity adjustment value is increased till an output from the sensor reaches an on state (a state where the "presence of a body" is determined) (ST3 and 4). When in on state, a sensitivity adjustment value displayed on the display section 21 is checked at the time point. If the numerical value displayed here is less than a prescribed lower limit value T1, a sensitivity adjustment value is determined as "NO" in ST5, and in ST7, a processing is conducted that moves the body toward the head section 1. If the numerical value displayed here is more than a prescribed upper limit value T2, a sensitivity adjustment value is determined as "NO" in ST6, and in ST8, a processing is conducted that moves the body away from the head section 1.

After the processing moving the body toward the head section 1 or away from the head section 1 is executed, the process returns back to ST2 and a resetting operation and others are conducted to thereby reset a sensitivity adjustment value. A sensitivity adjustment value when an on output is obtained is confirmed while a sensitivity adjustment value is gradually increased in a similar manner to that as described above.

If a sensitivity adjustment value when an on output is given takes a value between the lower limit value T1 and the upper limit value T2 at a prescribed time point, determinations in ST5 and ST6 are both "YES," completing the adjustment operation.

According to the above procedure, a user disposes a body at a position spaced away from the head section 1 by a desired distance and conducts sensitivity adjustment till the on/off signal transitions from an off state to an on state. In the course of operation, by setting a sensitivity of a characteristic curve corresponding to the detection distance of a rating to the lower limit T1, a necessity arises for the body to move in a forward direction since an on state of an output is obtained at a sensitivity adjustment value less than the T1 in a case where a current position of the body is farther than the detection distance of a rating. Therefore, a detection distance capable of stably detecting the body can be determined and at the same time, a sensitivity suitable for the detection distance can be set. Note that the upper limit value T2 has only to be set to a value suitable for the purpose of a user and may be the maximum of 255.

Then, in a case where the soft oscillation type oscillation circuit 10 is employed in order to measure a distance of a body, generally, the maximum distance that a user desires to measure is set as a detection distance; therefore, a sensitivity is desirably adjusted while the detection distance is maintained. In a case where a change in oscillation amplitude in the vicinity of a set detection distance is small or an oscillation amplitude is close to be in a saturated state, precision of detection becomes unstable; therefore it is necessary to select a sensitivity adjustment value so as to enable a sensitivity suitable for the detection distance (a sensitivity in the vicinity of a peak of FIG. 9(2)) to be obtained.

A general user, however, is not familiar with a characteristic of oscillation as shown in FIG. 9. Especially in a case where a user conducts sensitivity adjustment for the first time, the user has a high possibility of absolutely no grasping a sensitivity adjustment value suitable for a detection distance. Hence, a necessity arises for some help to be offered in adjustment operation with an index to be used instead of a sensitivity adjustment value.

In a case where the soft oscillation type oscillation circuit 10 is, after consideration of the above problem, adopted in the proximity sensor with one of the constructions of FIGS. 1 to 3, an output value from the A/D converter 24, that is a value of an oscillation amplitude, is displayed on the display section 21. A procedure in adjustment operation is implemented in a flow as shown in FIG. 12.

Figure 12:
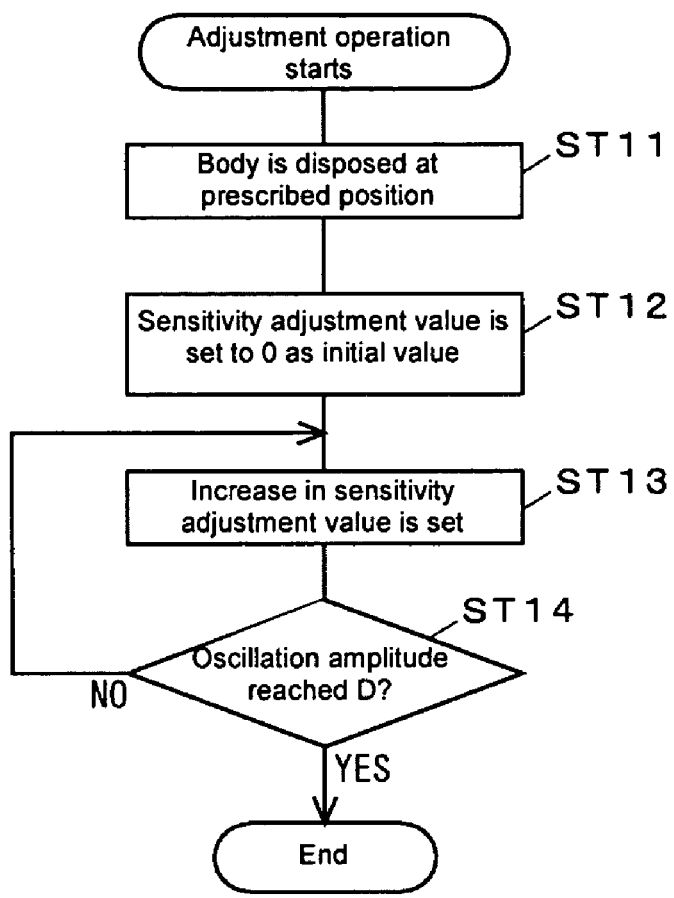
FIG. 12 shows a flowchart showing a procedure of an adjustment operation.

In the procedure of FIG. 12, as well, a user conducts an initial setting of a sensitivity adjustment value to 0 after the user disposes a body at a position corresponding to a distance desired to be set by him or her (ST1 and 12). Thereafter, a sensitivity adjustment value is set so as to increase till indication of an oscillation amplitude reaches a prescribed value D (ST13 and 14). Note that a value of the D is necessary to be more than a threshold value for determination on the presence or absence of a body and less than an oscillation amplitude in a saturated state. If an oscillation amplitude at a position corresponding to a detection distance, which may be any value is taken, is the D, necessity arises for an oscillation amplitude to show a large change over positions before and after the body. In light of such a point and an oscillation state at each sensitivity adjustment value, it is desirable to set a value of about 70% of the oscillation amplitude in a saturated state as D.

According to the procedure, since the user can set a sensitivity adjustment value so that an oscillation amplitude takes a state suitable for detection, the user can set a good sensitivity, regardless of a detection distance set by the user.

According to the procedures shown in FIGS. 11 and 12, an adjustment operation can be conducted while an index for adjustment is displayed on the display section 21. Therefore, in a case where plural sensors with the same performance are used in similar conditions, as well, a setting is performed on one sensor according to the procedure and thereafter, the rest of sensors are adjusted so as to present the same value as that presented at the end point of adjustment for the first sensor, thereby enabling a variance in sensitivity over the sensors to be eliminated with the result of measurement with good precision. Note that, in a case of soft oscillation type proximity sensors, if a sensitivity setting is performed on a first sensor according to the procedure of FIG. 12 and thereafter, a display is changed over to a sensitivity adjustment value, similar setting can be performed on the rest of sensors with a sensitivity adjustment value as an index.

The procedures of FIGS. 11 and 12 are both executed by a user, while, instead thereof, CPU 20 may adjust a magnitude of an oscillation amplitude by updating a sensitivity adjustment value with one increase in the value at a time. In this case, the hard oscillation type oscillation circuit 10, when being used, has only to perform updating of a sensitivity adjustment value till an oscillation amplitude reaches a threshold value for detection of a body. On the other hand, the soft oscillation type oscillation circuit 10, when being used, has only to perform updating of a sensitivity adjustment value till an oscillation amplitude reaches a value of the D.

In a case of the hard oscillation type oscillation circuit 10, if a sensitivity adjustment value when an oscillation amplitude reaches the threshold value becomes less than the lower limit value T1, it is desirable to display an error code on the display section 20 to thereby inform the fact to the user.

According to the construction shown in FIG. 1, since the preamplification section 3 together with the head section 1 constitutes the detection section, the amplification section 2 is necessary to be provided to each head section 1, while the amplification section 2 can be common to plural kinds of head sections. In this case, the amplification section 2 can set optimal sensitivities adapted for the characteristics of respective head sections 1.

Figure 13:
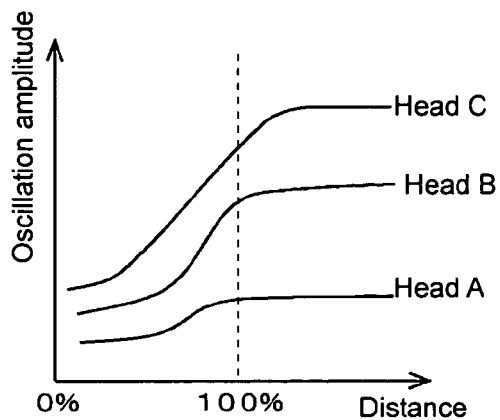
FIGS. 13(1) to 13(3) show graphs showing examples of sensitivity adjustment on plural kinds of head sections.
Figure 13:
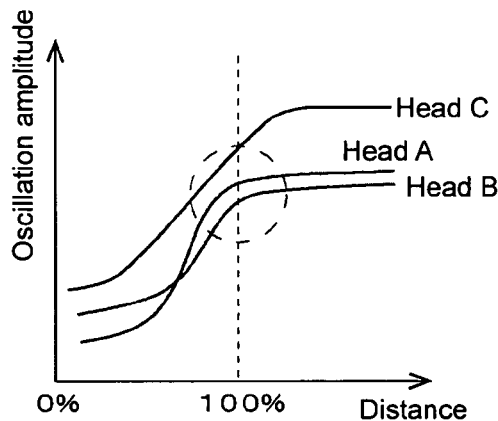
Figure 13:
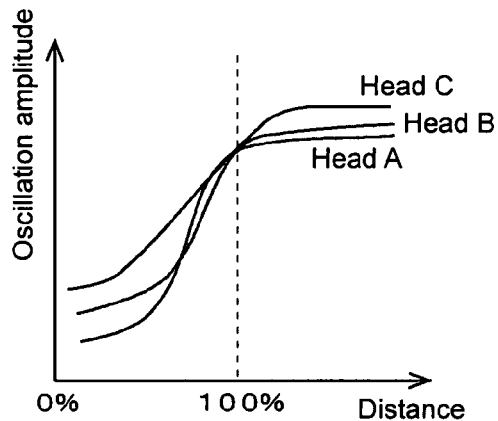

FIG. 13(1) exemplifies three head sections 1 (which are indicated with head A, head B and head C for convenience in description) having different relationships between an oscillation amplitude and a distance. FIG. 13(2) shows a result of adjustment by means of a conventional method in which a resistance value is changed for each of characteristic curves of FIG. 13(1), and FIG. 13(3) shows a result of adjustment with a sensitivity adjustment value of this example applied on the characteristic curves.

In a case of adjustment by changing-over between variable resistors for sensitivity adjustment, a user has had difficulty grasping a proper operation quantity of a volume. As a result, changes in oscillation altitude after the adjustment, as shown in FIG. 13(2), are different in the respective head sections 1, having led to a problem of large variance in set sensitivity among the sections.

In contrast to this, a proximity sensor of this example, as described above, can adjust a sensitivity adjustment value while displaying a numerical value indicating an oscillation amplitude. Hence, by adjusting a sensitivity adjustment value on each of the head sections so as to reduce a difference in oscillation amplitude between or among the head sections, a variance in sensitivity over the head sections can be less.

According to a proximity sensor with the construction of FIG. 3, since a value of a feedback current can be determined by CPU 20, more detailed control can be conducted so as to match an installment environment of a sensor or the purpose of use of a sensor.

Figure 14:
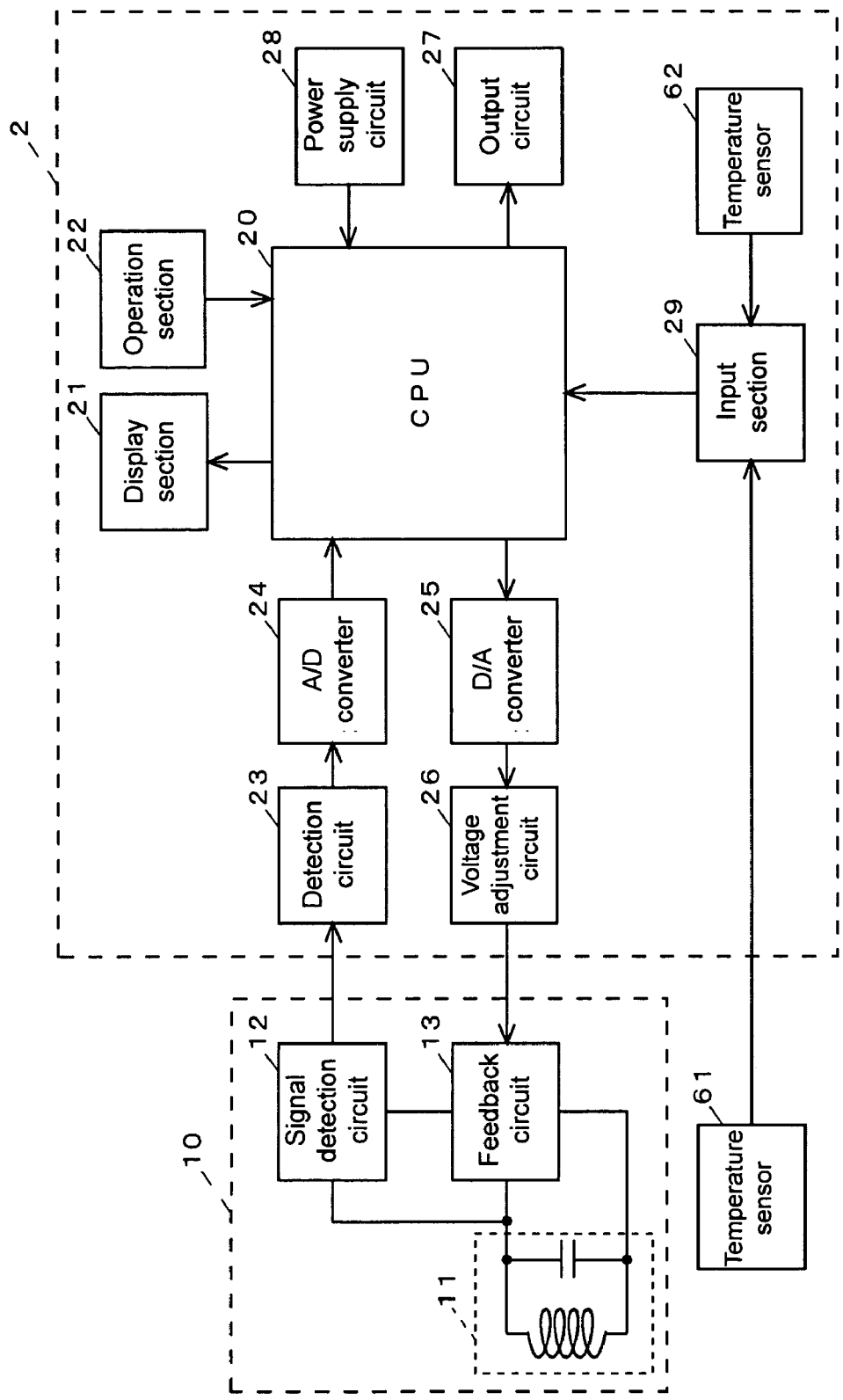
FIG. 14 shows a block diagram showing another example electric configuration of the proximity sensor.

FIG. 14 shows a configuration capable of controlling an oscillation amplitude depending on a change in environmental temperature of a sensor. Since a main part of the configuration of FIG. 14 is similar to that shown in FIG. 3, the same symbols as in FIG. 3 are attached and detailed description thereof is omitted.

The example of FIG. 14 includes: temperature sensors 61 and 62 provided to the head section 1 (not shown here) and the amplification section 2, respectively, and the amplification section 2 includes: an input section 29 for inputting measured values by the temperature sensors 61 and 62 to CPU 20. A memory attached to CPU 20 has a correction table, incorporated in the memory, for correcting a sensitivity adjustment value based on a temperature. In the correction table, temperature values are classified into plural sections and correction values for a sensitivity adjustment value are related to the respective sections thereof.

A temperature sensor may be provided to one of the head section 1 and the amplification section 2. Especially, in a case where the head section 1 is located in a place in which a change in temperature is large, it is desirable to provide a temperature sensor on the head section 1 side.

FIGS. 15(1) and 15(2) show a principle in correction using temperature information based on a relationship between a distance and an oscillation amplitude at environmental temperatures of 25, 60 and −10 degrees.

FIG. 15(1) is characteristic curves before correction related to temperatures. From the curves, it is found that as an environmental temperature is raised, an oscillation amplitude increases, while as an environmental temperature is lowered, an oscillation amplitude decreases.

FIG. 15(2) shows an example in which correction is conducted so that a characteristic curves at 60 degrees and a characteristic curves at −10 degrees match characteristic curves at 25 degrees CPU 20 corrects a sensitivity adjustment value inputted from the operation section 22 based on a measured value of a temperature under the above principle and outputs a value after the correction as a sensitivity adjustment signal. Note that a correction value necessary for the correction is read from the correction table of the memory.

For example, a prescribed temperature (for example 25 degrees) is set as an ordinarily temperature in advance and when temperatures detected by the temperature sensors 61 and 62 are higher than the ordinary temperature, a sensitivity adjustment value is corrected to a value less than an input value to thereby reduce an oscillation amplitude. When temperatures detected by the temperature sensors 61 and 62 are lower than the ordinary temperature to the contrary, a sensitivity adjustment value is corrected to a value more than an input value to thereby increase an oscillation amplitude.

FIGS. 16(1) to 16(3) shows an example in which the sensitivity adjustment signal is used for control in a case where plural proximity sensors are used in the vicinity with each other or one another.

In a case where plural proximity sensors are disposed close to each other or one another, the sensors have been conventionally changed over therebetween and controlled so as to be alternately oscillated in order to prevent a mutual interference between or among sensors. FIG. 16(1) is an concrete example and three sensors A, B and C are in a regular order oscillated for the same time length. Note that change-over between oscillation of sensors can be controlled by a control signal from external host equipment or by mutual communication between sensors.

With the control applied, one sensor can perform a processing for detecting a body without receiving an influence from an action of another sensor.

In a conventional control, however, since no signal with a sufficient magnitude is outputted at a leading edge of oscillation, as shown in FIG. 16(2), it takes along time T till the oscillation is stabilized, providing a possibility to receive an influence of a noise during the time T.

Contrast to this, in the proximity sensor with the configuration of FIG. 3, a sensitivity adjustment signal at the leading edge of oscillation is, as shown in FIG. 16(3), rendered more than an essential set value and thereafter, control is executed such that the sensitivity adjustment signal is restored to the essential value. With such a configuration adopted, the time T till oscillation is stabilized can be greatly reduced, thereby enabling stable detection to be realized.

Figure 17:
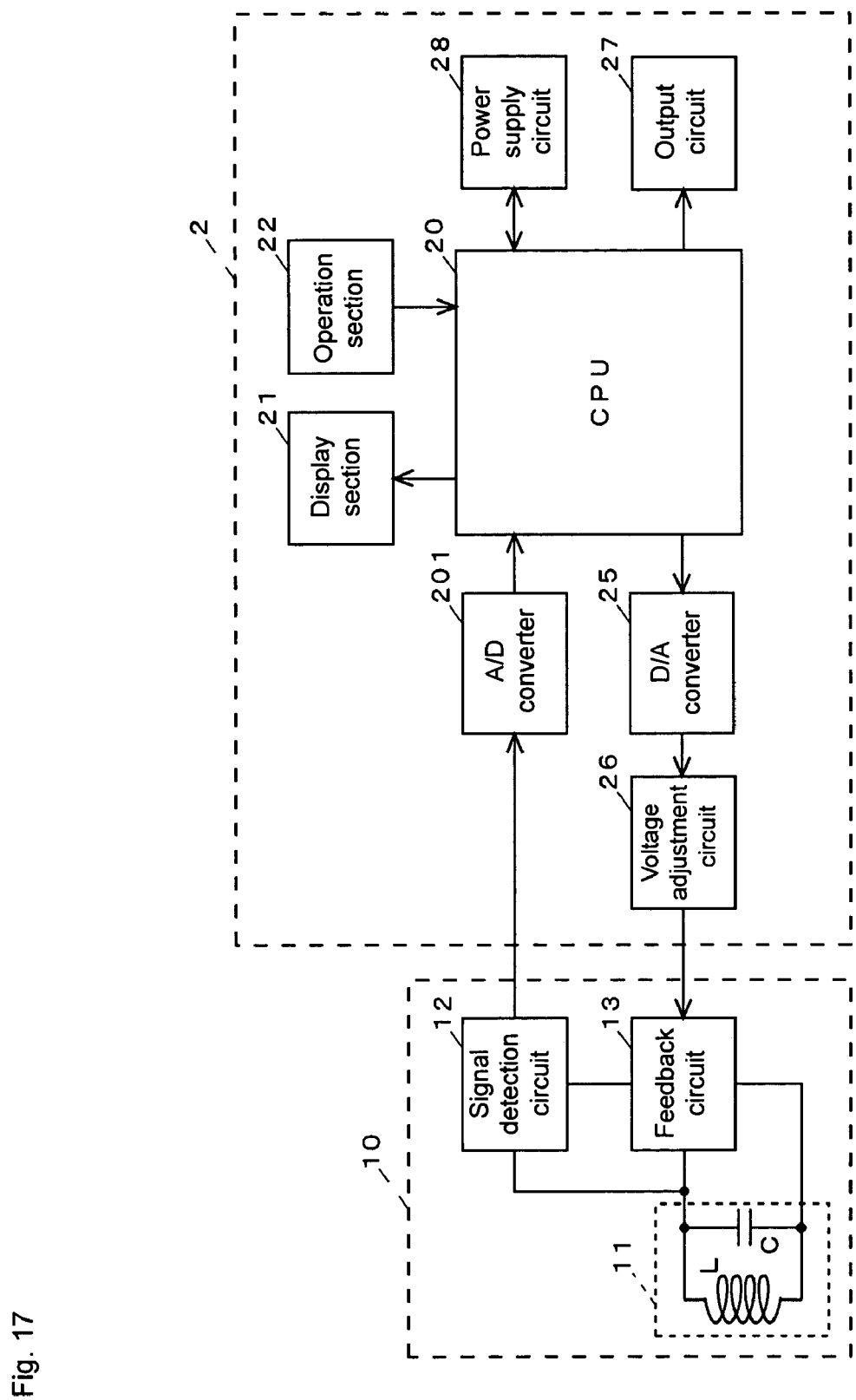
FIG. 17 shows a block diagram showing still another electric configuration of the proximity sensor.

The above description has presented with a proximity sensor of a type detecting an oscillation amplitude as an example, while the invention can be applied to a frequency detection type proximity sensor. In FIG. 17, there is shown an example application thereof.

In a proximity sensor of this example, the oscillation circuit 10 is of the configuration, similar to that in FIG. 3, in which in the amplification section 2, a frequency counter 201 is disposed instead of the detection circuit 23 and the A/D converter 24. In this example, a sensitivity adjustment signal from the D/A converter 25 is increased or decreased to thereby increase or decrease a feedback quantity of a current, thereby enabling an oscillation frequency to be adjusted.

In this example, as well, a sensitivity adjustment value is inputted from the operation section 22, thereby enabling a sensitivity adapted for the input value to be set. Besides, in this example, as well, a sensitivity adjustment value is adjusted till a display on the frequency counter 201 indicates a prescribed value, thereby enabling a sensitivity suitable for detection of a body to be set.

Figure 18:
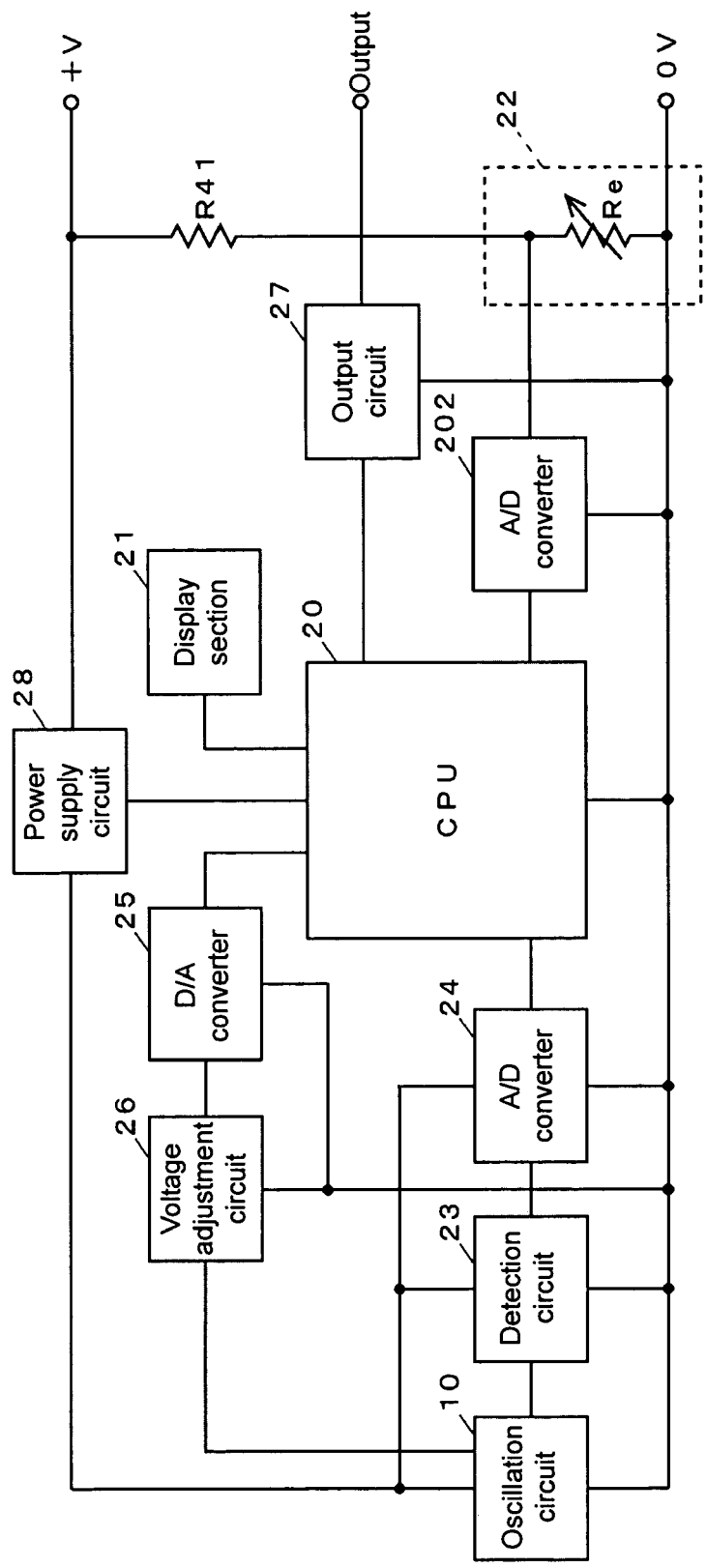
FIG. 18 shows a block diagram showing yet another electric configuration of the proximity sensor.

FIG. 18 shows another example of oscillation detection type proximity sensor. Note that the proximity sensor of this example, as well, has a main configuration similar to that of FIG. 3, while there is shown a detailed relationship between parts of the construction and the power supply circuit 28.

In the proximity sensor of this example, a volume including a variable resistor Re is incorporated as the operation section 22 instead of the construction of FIG. 2. The variable resistor Re is connected to ground potential at one end thereof, while being connected to the a positive potential V through a resistor R41 at the other end thereof. An A/D converter 202 is connected to a point on a connection line between the variable resistor Re and the resistor R41. The A/D converter 202 is connected to CPU 20 in a similar way to that of the A/D converter 24 on the detection circuit 23 side.

The A/D converter 202 detects a potential between the variable resistor Re and the resistor R41. CPU 20 captures the detection potential as an operation quantity of the volume to convert the potential to a prescribed numerical value and to present the value on the display section 21. At the same time, CPU 20 outputs the numerical value outputted to the display section 21, to the D/A converter 25 as a sensitivity adjustment signal.

With the configuration adopted, since a rotational quantity of the volume can be obtained as a numerical value to show clearly to a user, a variance in setting can be eliminated. A feedback current can be adjusted in prescribed units using a sensitivity adjustment signal in a digital quantity.

Figure 19:
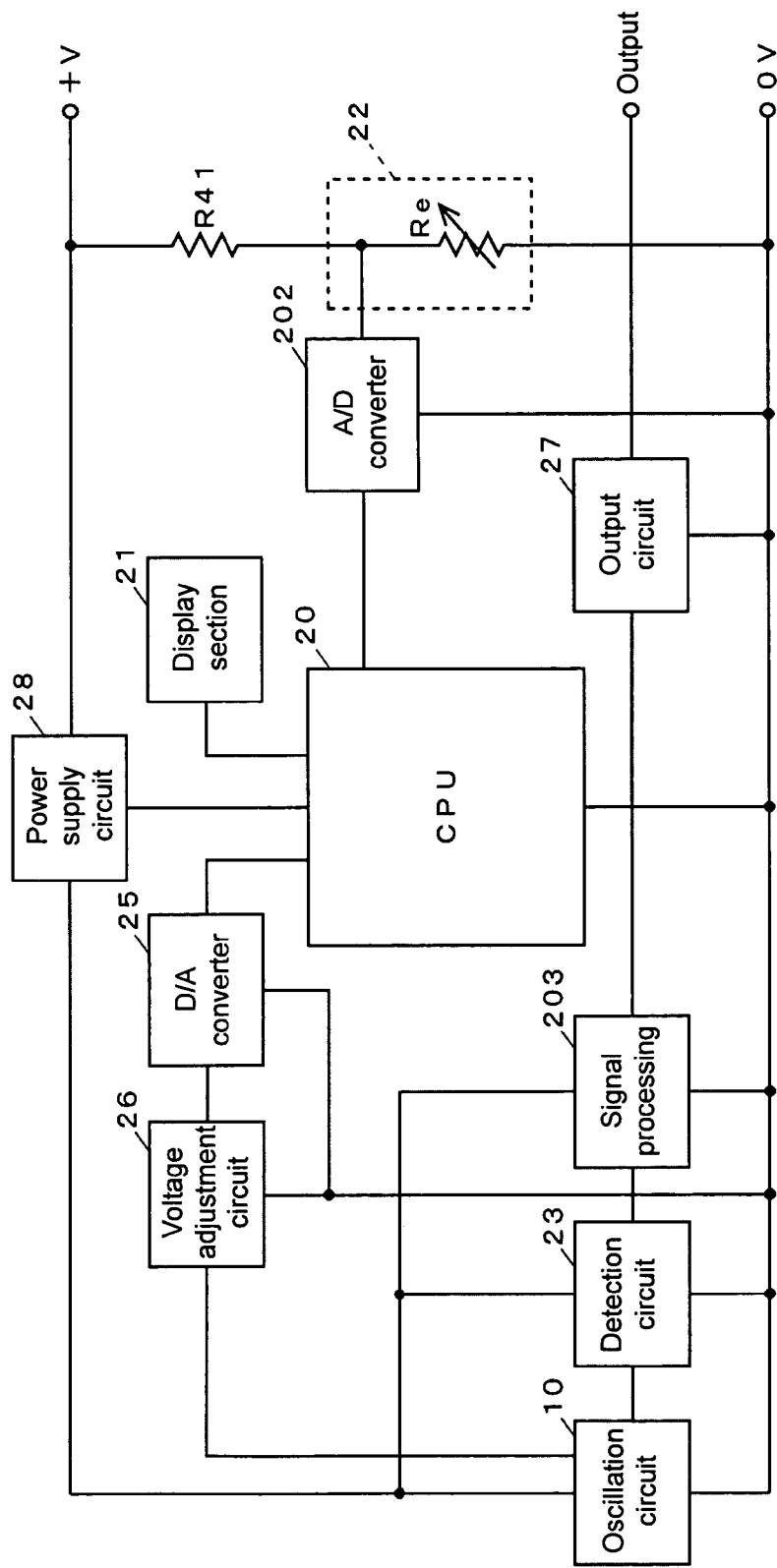
FIG. 19 shows a block diagram showing a further electric configuration of the proximity sensor.

FIG. 19 is obtained by deforming the configuration of FIG. 18 and common constituents in the configuration are attached with similar symbols to those in FIG. 18. In the proximity sensor of this example, not only is the A/D converter 24 connected to the detection circuit 23 replaced with a signal processing circuit 203, but the signal processing circuit 203 is connected directly to the output circuit 27. The signal processing circuit 203 includes a comparator, compares the detected signal with a prescribed threshold value and outputs an on/off signal indicating a result of the comparison to the output circuit 27.

With the configuration adopted, the presence or absence can be determined without using CPU 20, thereby enabling a response of a proximity sensor to be faster.

Note that while, in the examples, a voltage applied to the feedback circuit 13 of the oscillation circuit 10 is adjusted to thereby adjust a feedback current, a circuit or IC conducting current control may be used instead thereof to thereby adjust a feedback current of the oscillation circuit 10. In the latter case, a current quantity can be controlled according to a value of a sensitivity adjustment signal from CPU 20.

What is claimed is:

1. A proximity sensor comprising:
an oscillation circuit having a coil;
a detection device detecting a metal body using an oscillation amplitude of the oscillation circuit;

an output device outputting a result of the detection conducted by the detection device; and an adjustment device adjusting a state of a change in oscillation amplitude relative to a change in distance between the coil and the metal body, wherein a feedback circuit designed so as to change a quantity of a feedback current according to an applied voltage is incorporated in the oscillation circuit, and wherein the adjustment device includes:

a signal generation device generating an adjustment signal in digital quantity indicating a level of a voltage applied to the feedback circuit in the oscillation circuit; and a signal output device digital-to-analog converting the adjustment signal to output the resulted signal to the feedback circuit.

2. A proximity sensor, comprising:

an oscillation circuit having a coil;

a detection device detecting a metal body using an oscillation amplitude of the oscillation circuit;

an output device outputting a result of the detection conducted by the detection device;

an adjustment device adjusting a state of a change in oscillation amplitude relative to a change in distance between the coil and the metal body, wherein a feedback circuit designed so as to change a quantity of a feedback current according to an applied voltage is incorporated in the oscillation circuit, and wherein the adjustment device includes:

a signal generation device generating an adjustment signal in digital quantity indicating a level of a voltage applied to the feedback circuit in the oscillation circuit; and a signal output device digital-to-analog converting the adjustment signal to output the resulted signal to the feedback circuit;

an operation section for sensitivity adjustment; and a display section for displaying information showing information indicating a value of the adjustment signal or information indicating a magnitude of an oscillation amplitude, wherein the signal generation device in the adjustment device sets a value of the adjustment signal depending on operation in the operation section, and wherein the proximity sensor comprises a display control device controlling a display on the display section using an oscillation amplitude when a value of the adjustment signal set by the signal generation device or a signal after digital-to-analog conversion of the adjustment signal is outputted to the feedback circuit.

3. The proximity sensor according to claim 1, wherein the adjustment device includes:

a control device causing the signal generating device to repetitively conduct processing changing a value of the adjustment signal stepwise with increase or decrease by a prescribed unit at a time till an oscillation amplitude reaches a prescribed value; and a registration device registering a value of the adjustment signal when the oscillation amplitude reaches the prescribed value.

4. The proximity sensor according to claim 1, further comprising a temperature measurement device for measuring an environmental temperature, wherein the signal generation device of the adjustment device includes a correction device correcting a value of the adjustment signal based on a value measured by the temperature measurement device.

5. A proximity sensor comprising:

an oscillation circuit having a coil;

a detection device detecting a metal body using an oscillation amplitude of the oscillation circuit;

an output device outputting a result of the detection conducted by the detection device; and an adjustment device adjusting a state of a change in oscillation amplitude relative to a change in distance between the coil and the metal body, wherein the oscillation circuit includes:

a feedback circuit designed so as to change a quantity of a feedback current according to an applied voltage;

an operation section for setting a value of a voltage applied to the feedback circuit; and a display section displaying information indicating a set value of the voltage or information indicating an oscillation amplitude, and wherein the adjustment device is constructed so as to apply a voltage changing according to the setting in the operation section to the feedback circuit in the oscillation circuit.

6. The proximity sensor according to claim 5, wherein the display section is a numerical value display section displaying a numerical value corresponding to a voltage set by the operation section or to an oscillation amplitude of an oscillation circuit to which the voltage is applied.

7. A proximity sensor, comprising:

an oscillation circuit having a coil;

a detection device detecting a metal body using an oscillation amplitude of the oscillation circuit;

an output device outputting a result of the detection conducted by the detection device; and an adjustment device adjusting a state of a change in oscillation amplitude relative to a change in distance between the coil and the metal body, wherein a feedback circuit designed so as to change a quantity of a feedback current according to an applied voltage is incorporated in the oscillation circuit, and wherein the adjustment device includes:

a signal generation device generating an adjustment signal in digital quantity indicating a level of a voltage applied to the feedback circuit in the oscillation circuit; and a signal output device digital-to-analog converting the adjustment signal to output the resulted signal to the feedback circuit, wherein the adjustment device includes a voltage control device changing an applied voltage to the feedback circuit from a voltage for setting an oscillation amplitude with a magnitude not reacting with the metal body according to a signal from outside to a voltage larger than a voltage to be normally set, and further adjusting the applied voltage so as to take a value to be normally set when a prescribed time elapses after the change.

8. A proximity sensor, comprising:

an oscillation circuit having a coil;

a detection device detecting a metal body using an oscillation amplitude of the oscillation circuit;

an output device outputting a result of the detection conducted by the detection device; and an adjustment device adjusting a state of a change in oscillation amplitude relative to a change in distance between the coil and the metal body, wherein the oscillation circuit includes:

a feedback circuit designed so as to change a quantity of a feedback current according to an applied voltage;

an operation section for setting a value of a voltage applied to the feedback circuit; and a display section displaying information indicating a set value of the voltage or information indicating an oscillation amplitude, wherein the adjustment device is constructed so as to apply a voltage changing according to the setting in the operation section to the feedback circuit in the oscillation circuit, and wherein the adjustment device includes a voltage control device changing an applied voltage to the feedback circuit from a voltage for setting an oscillation amplitude with a magnitude not reacting with the metal body according to a signal from outside to a voltage larger than a voltage to be normally set, and further adjusting the applied voltage so as to take a value to be normally set when a prescribed time elapses after the change.

* * * * *